United States Patent
Crispin et al.

(10) Patent No.: US 10,211,385 B2
(45) Date of Patent: Feb. 19, 2019

(54) THERMOELECTRIC DEVICE

(71) Applicants: Xavier Crispin, Kimstad (SE); Magnus Berggren, Vreta Kloster (SE); Hui Wang, Linkoeping (SE)

(72) Inventors: Xavier Crispin, Kimstad (SE); Magnus Berggren, Vreta Kloster (SE); Hui Wang, Linkoeping (SE)

(73) Assignee: Rise Acreo AB, Kista (SE)

( * ) Notice: Subject to any disclaimer, the term of this patent is extended or adjusted under 35 U.S.C. 154(b) by 835 days.

(21) Appl. No.: 13/866,576

(22) Filed: Apr. 19, 2013

(65) Prior Publication Data
US 2013/0276850 A1 Oct. 24, 2013

(30) Foreign Application Priority Data

Apr. 20, 2012 (EP) .................................. 12165063
Jun. 8, 2012 (EP) .................................. 12171349
Jun. 8, 2012 (EP) .................................. 12171357

(51) Int. Cl.
- H01L 35/24 (2006.01)
- H01L 35/28 (2006.01)
- H01L 37/00 (2006.01)

(52) U.S. Cl.
CPC ............. H01L 35/28 (2013.01); H01L 35/24 (2013.01); H01L 37/00 (2013.01)

(58) Field of Classification Search
CPC .......... H01L 35/28; H01L 35/24; H01L 37/00
See application file for complete search history.

(56) References Cited

U.S. PATENT DOCUMENTS

| 4,442,185 A | 4/1984 | Skotheim |
| 4,510,195 A * | 4/1985 | Iida ........................... B32B 3/10 136/256 |
| 6,101,298 A * | 8/2000 | Den Broeder ........ G02F 1/1523 385/16 |

(Continued)

FOREIGN PATENT DOCUMENTS

| FR | 1306252 | 10/1962 |
| GB | 1346783 | 2/1974 |

(Continued)

OTHER PUBLICATIONS

European Search Report dated Mar. 25, 2013 issued in European Application No. 12171357.2.

(Continued)

Primary Examiner — Lindsey A Bernier
(74) Attorney, Agent, or Firm — Harness, Dickey & Pierce, P.L.C.

(57) ABSTRACT

The present invention provides thermoelectric device comprising a first electrode, a second electrode, a first electrolyte composition capable of transporting cations, a second electrolyte composition capable of transporting anions and a connector comprising mobile cations and mobile anions, wherein the first electrolyte composition is connected to said first electrode by being in ionic contact and the second electrolyte composition is connected to said second electrode by being in ionic contact and said connector is in ionic contact with said first and said second electrolyte composition, such that an applied temperature difference over said electrolyte compositions or an applied voltage over said electrodes facilitate transport of ions to and/or from said electrodes via said electrolyte compositions. There is also provided a method for generating electric current and a method for generating a temperature difference.

11 Claims, 20 Drawing Sheets

(56) References Cited

U.S. PATENT DOCUMENTS

| | | | |
|---|---|---|---|
| 8,227,105 B1* | 7/2012 | Gerald, II | H01M 2/1646 29/623.5 |
| 2008/0041438 A1* | 2/2008 | Saito | H01G 9/2018 136/244 |
| 2010/0186398 A1* | 7/2010 | Huber | H01L 35/30 60/320 |
| 2011/0186101 A1* | 8/2011 | Melanson | H01L 35/28 136/203 |
| 2014/0113127 A1* | 4/2014 | Tominaga | H01M 4/583 428/323 |

FOREIGN PATENT DOCUMENTS

| JP | 4028270 | 1/1992 | | |
|---|---|---|---|---|
| JP | WO2012157506 | * 11/2012 | | H01L 31/00 |

OTHER PUBLICATIONS

Bubnova, O. et al. "Optimization of the thermoelectric figure of merit in the conducting polymer poly(3,4-ethylenedioxythiophene)," *Nature Materials*, vol. 10, No. 6, Jun. 2011, pp. 429-433.

Extended European Search Report dated Sep. 27, 2013 issued in corresponding European Application No. 13164511.1.

Martin, B. et al. "A thermoelectric voltage effect in polyethylene oxide," *Journal of Physics D: Applied Physics*, vol. 36, 2003, pp. 343-347.

Reznikov, M. et al. "Space Charge Effects in the Solid Polymer Electrolyte," MRS Spring Meeting, Apr. 25-29, 2011, *MRS Proceedings*, vol. 1331, 2011.

* cited by examiner

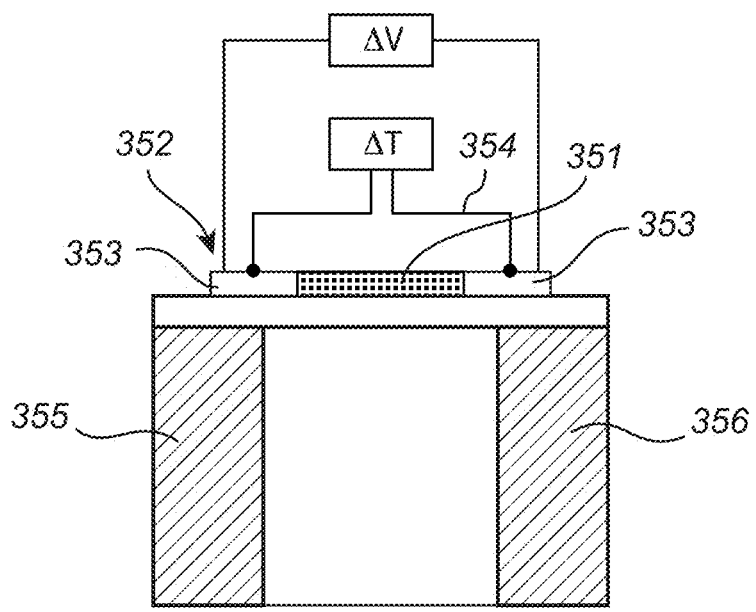
*Fig. 3*
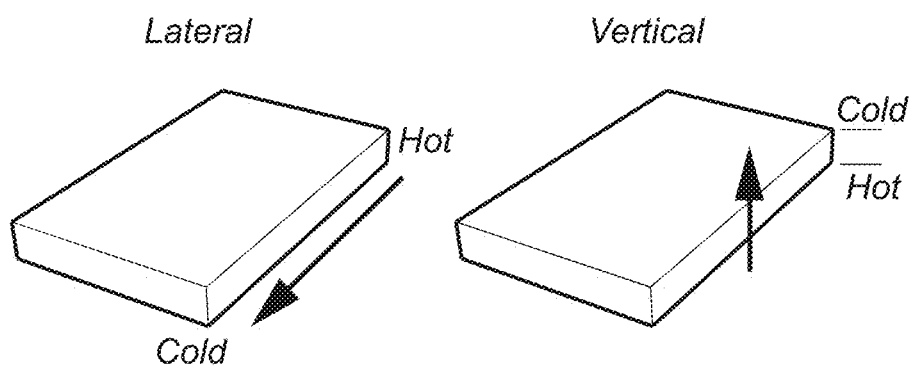
*Fig. 4a*   *Fig. 4b*

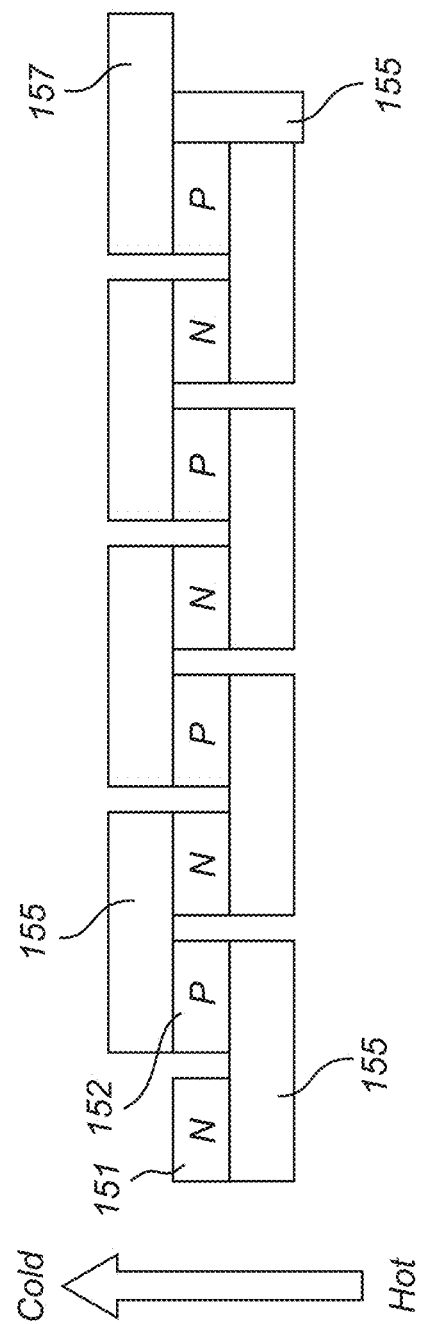

THERMOELECTRIC DEVICE

CROSS REFERENCE TO RELATED APPLICATIONS

This application claims the benefit of U.S. Provisional Application No. 61/636,175, filed Apr. 20, 2012, and the benefit of European Application Nos. 1265063.4, filed Apr. 20, 2012, 12171357.2, filed Jun. 8, 2012, and 12171349.9, filed Jun. 8, 2012, in the European Patent Office, the disclosure of each of which is incorporated herein in its entirety by reference.

FIELD OF THE INVENTION

The present invention is directed to thermoelectric devices, such as thermoelectric generators (TEG) for converting a temperature difference into electricity, and thermoelectric coolers for pumping heat with electrical power.

BACKGROUND TO THE INVENTION

A conventional thermoelectric device is a semiconductor device that converts a temperature difference into electricity or vice versa. The most common thermoelectric device is the thermoelectric generator (TEG), which converts a temperature difference into electricity, and which is composed of semiconductor legs, p-type and n-type legs connected in series electrically, and in parallel thermally. The thermoelectric material in TEGs is generally characterized with three fundamental properties: a high electrical conductivity ($\sigma$), a large Seebeck coefficient, $\alpha$ and a low thermal conductivity ($\lambda$). Those properties are gathered in the so-called thermoelectric figure-of-merit (ZT), where $ZT=\sigma\alpha^2 T/\lambda$, and Z is a measure of a material's thermoelectric properties, T is the absolute temperature. The Seebeck coefficient is a measure of the magnitude of an induced thermoelectric voltage in response to a temperature difference across that material, which may also be called the thermopower or thermoelectric power of a material. In order to achieve a thermoelectric material with high efficiency, the material should preferably have both high thermodiffusion and low thermal conductivity at the same time. However, it is difficult to find materials with these characteristics. The importance of the material properties, its ZT values, is due to the fact that it is directly connected with the efficiency of the thermoelectric devices. High ZT materials give efficient devices.

The thermoelectric cooler, which pumps heat from one side to the other side to create a temperature difference thanks to an electrical power, is also a thermoelectric devices, called Peltier cooler.

Currently, thermoelectric devices are mostly used as for example in Peltier coolers, temperature sensors However, they are regarded to have great potential for electricity production from waste heat and natural heat source (geothermal, solar) in the future, but in order to be used as large-area heat exchangers or in combination with large area solar cells, there is a need to develop TEGs which are suitable for large areas and suitable for low-temperature applications (below 200° C.).

Several families of materials have been considered as thermoelectric materials: semi-metals, metal-oxide, and inorganic semiconductor materials. Up to now, the best thermoelectric materials for use at temperatures up to 200° C. are heavy metal alloys composed of low natural abundance, such as for example $Bi_2Te_3$. This material is used since it has both high Seebeck effect and low thermal conductivity. The thermoelectric figure-of-merit is close to 1. However, it would be very expensive to create a large area heat exchanger from this material. In addition, the toxicity is a disadvantage.

There are only few studies on the use of organic materials for thermoelectric applications since organic materials have been regarded to have too low thermoelectric figure-of-merit to be interesting for use in thermoelectric devices. Recently, the thermoelectric properties of a modified conductive polymer has been investigated, see *Optimization of the thermoelectric figure of merit in the conducting polymer poly(3,4-ethylenedioxythiophene)* Bubnova et al, *Nature Materials* vol. 10, June 2011. Here, the p-type leg is made of PEDOT-Tos (PEDOT=Poly(3,4-ethylenedioxythiophene), Tos=tosylate) treated with tetrakis(dimethylamino)ethylene (TDAE) and the n-type leg is obtained from an organic salt TTF-TCNQ. Both legs are electrically connected to a top Au electrode. The thermoelectric figure-of-merit for this conducting polymer was found to be 0.25.

However, there is still a great demand for TEGs for low temperature applications (below 200° C.) having high thermoelectric figure of merit and which can be produced at low cost and still be environmentally friendly.

SUMMARY OF THE INVENTION

One object of the invention is to overcome or at least alleviate one or more of the above mentioned drawbacks.

This and other objects are met by the subject matters provided in the independent claims. Preferred embodiments of the invention are presented in the dependent claims.

As a first aspect of the invention, there is provided a thermoelectric device comprising a first electrode, a second electrode, a first electrolyte composition capable of transporting cations, a second electrolyte composition capable of transporting anions and a connector comprising mobile cations and mobile anions, wherein the first electrolyte composition is connected to said first electrode by being in ionic contact and the second electrolyte composition is connected to said second electrode by being in ionic contact and said connector is in ionic contact with said first and said second electrolyte composition, such that an applied temperature difference over said electrolyte compositions or an applied voltage over said electrodes facilitate transport of ions to and/or from said electrodes via said electrolyte compositions.

The thermoelectric device as defined above is based on a new main principle. While prior art devices are based on electron transport within the thermoelectric device, the present invention utilizes ion transport. Advantages of the present invention are, for instance, high efficiency, low manufacturing costs and printability. Since all the functional materials for fabricating the thermoelectric device can be solution based, it is feasible to implement the thermoelectric devices on a flexible substrate by printing or other liquid deposition techniques.

In other words, while prior art devices relies on electron transport in order to obtain a thermoelectric effect (Seebeck effect), the present invention utilizes ions as charge carriers. In the present invention, the obtained ionic thermoelectric effect is a direct consequence of the transport, e.g. thermodiffusion, of ions (Soret effect) and the specific components of the constructed devices.

Areas wherein the present invention may be used are, for instance, in waste heat management in electricity production (power plants), process industries, transportations or other places where a lot of heat is normally lost to the surroundings. The present invention may also be used in renewable power sources, such as geothermal or solar heat sources or advantageously in combination with solar cells.

The transported ions may be transported via the electrolyte composition between the electrodes or from a storage, such as from a connector, to the electrodes.

According to an embodiment there is provided a thermoelectric device comprising a first electrode comprising a first conductive polymer composition capable of being reduced and/or oxidized, and a second electrode comprising a second conductive polymer composition capable of being reduced and/or oxidized;

an electrolyte composition:

wherein the first and second electrodes are ionically coupled via the electrolyte composition such that an applied temperature over the electrolyte composition or an applied voltage over the electrodes facilitate transport of ions to and/or from the electrodes via the electrolyte composition, thereby driving a reduction-oxidation (redox) reaction comprising the conductive polymers at the electrodes.

The term "driving a reduction-oxidation (redox) reaction" refers to the transport of ions triggering reduction of a conducting polymer at one electrode and oxidation of a conducting polymer at the other electrode, respectively.

Thermoelectricity allows for reversible interplay between heat flow (temperature gradient) and charge flow (electricity current). A thermoelectric effect may be obtained in various ways. A thermoelectric effect wherein a heat flow transport charge carriers, thus producing a voltage, is an electric power source (the Seebeck effect). A reverse effect wherein an electrical current is used to generate a heat flow (Peltier effect) and create a temperature gradient. A third kind of thermoelectric effect is the so called Thomson effect wherein a temperature gradient together with an electrical current cause heat to be generated and absorbed, respectively.

In other words, the present invention relates to a thermoelectric device that utilizes a thermoelectric effect for producing an electric current due to a temperature gradient, and to a thermoelectric device for converting an electric current into a temperature gradient.

Transport of the ionic current is achieved by the electrolyte composition and the electrochemical reaction, i.e. the redox reactions at the electrodes, produces electrons that may be used in an external electric circuit.

The ions may be transported by means of thermodiffusion.

Thermodiffusion, also called thermophoresis or Soret effect, is a phenomenon observed when a mixture of two or more types of mobile particles subjected to a temperature gradient and the different types of particles respond to it differently. The term Soret effect normally implies thermodiffusion in liquids.

As used herein, ionic contact between a first and a second part of the device or "ionic coupled" means that the parts are arranged so that it is possible for ions to move from the first part to the second part and/or vice versa. This can be achieved by using direct physical contact (common interface) or by creating an ion transport path between the first and second part using an ion transporting material in physical contact with the first and second part. Additionally, the term direct ionic contact used herein means direct physical contact allowing for ions to be transported between the two parts.

Devices of the present disclosure may also be coupled in series to form thermoelectric assemblies.

The electrolyte composition may be comprised in or form a "leg" of the device. Thus, the device may comprise one or several legs for transport of the ions. A leg may be spatially separated from another leg so as to prevent transport of ions of opposite charge in the same leg.

In embodiments of the first aspect, the electrolyte composition is comprised in a single leg between the first and second electrodes.

In such an embodiment, the applied temperature difference may be between the two electrodes, thus driving ions from one electrode to the other via the electrolyte composition. All transported ions may then be of the same sign.

Consequently, when a temperature gradient or a temperature difference is imposed between the two electrodes, the ions may thermo-diffuse through the leg comprising an electrolyte composition towards the cold side and generate a measurable thermo-voltage.

In embodiments of the first aspect, the electrolyte composition comprises a polyelectrolyte, nanoparticles comprising ionic groups and/or an ionic liquid By the term an electrolyte, it is herein meant an ionically conducting medium, such as a solution of an ionic compound. An electrolyte allows ion movement. Further, an electrolyte is normally electrically isolative, i.e. it is not an electron conductive medium. In an electrolyte an electric current is normally carried only by the movement of ions.

According to an embodiment, the first and/or second electrolyte composition comprises a polymeric electrolyte, such as a polyelectrolyte or a polymer combined with a non-polymeric electrolyte.

As used herein, polyelectrolyte means an electrolyte comprising a polymer comprising anionic or cationic moieties.

Polyelectrolytes are polymers bearing an electrolyte group in their repeating units. Generally, the electrolyte groups can dissociate in aqueous solution such as water, making the polymers charged. They have the properties both from electrolytes (salts) and polymers (high molecular weight compounds), which can be also called polysalts.

Further a polyelectrolyte is an ionically conducting medium with a relatively high molecular weight such that the electrolyte has a low diffusion constant compared to the moveable ions, and thereby are less mobile. In other words, the small ions (or mobile ions) should have a larger diffusion constant $D_{mobile}$ [m$^2$/s] compared to the diffusion constant for the ions of the polyelectrolyte of opposite sign $D_{immobile}$ [m$^2$/s]. Preferably, the ratio between the two diffusion constants $D_{mobile}/D_{immobile}$ is at least 10, or at least 100, or at least 1 000, or at least 10 000 in a thermoelectric device according to the invention, which is ready for use.

In general, the diffusion constant can be measured e.g. by adding a marker (such as an optical marker or by using elemental analysis technique (such as NMR). There are plenty of optical markers (molecular fluorescent probes) that are charged dye molecules that can interact (via electrostatic attraction) either with the polyelectrolytes or the charged ions. Different markers may be used for the mobile ions and for the electrolyte, and one may thereby determine the different diffusion constants using Fick's diffusion law.

Alternatively or additionally, for stationary or truly immobile electrolytes it is only the mobile ions that is providing the electrical signal. So, in that situation, it is possible to determine the diffusion constant directly by a simple electrical method. Adding a high concentration salt in one reservoir and following the increase in electrical potential between the two electrodes is a direct way to determine the diffusion of ion. This may be repeated for several concentrations and thereafter extract the diffusion coefficient of the mobile ion.

For more information see e.g. Journal of the American Chemical Society [0002-7863] Umberger, J Q year:1945 vol:67 iss:7 pages:1099-1109, or Electrochimica Acta [0013-4686] Hayamizu, K year:2001 vol:46 iss:10-11 pages:1475-1485 or CATION AND WATER DIFFUSION IN NAFION ION EXCHANGE MEMBRANES: INFLUENCE OF POLYMER STRUCTURE. Yeager, H. L., Steck, A. 1981 Journal of the Electrochemical Society 128 (9), pp. 1880-1884.

The polyelectrolyte may thus be a polyanion or a polycation. If for example the device comprises a single leg between the first and the second electrodes, the leg may comprise a polyanion, such as PSSNa.

As discussed above, the electrolyte composition may preferably be a polyelectrolyte, as polyelectrolytes facilitates a prevention of that both cations and anions move in the same leg. A transport of both cations and anions in the same leg is undesirable, as it may result in charge cancellation that would minimize the Seebeck voltage and prevent significant redox reaction at the electrode. Thus, by using a negatively charged polymer in a first leg, cation transport is facilitated, and the use of a positively charged polymer in a second leg results in an enhanced anion transport.

Preferably, at least one of the first and second electrolyte compositions comprises cross-linked electrolytes. At humidity levels higher than 80% RH, the polyelectrolyte films can lose their mechanical integrity and dissolve in the absorbed water. To prevent this, the polyelectrolytes of the first and second electrolyte compositions may preferably be cross-linked.

In more detail, selective ion transport in a single leg or in a first leg out of several legs may hence be obtained by using a polymer capable of being anionic. Hence, the polymer backbone may comprise anionic moieties stabilized by mobile cations. A polyanion is an electrolyte wherein the ionic conductivity of anions is low compared to the ionic conductivity of cations. The polyanion is hence a polymer having the anionic moieties; this ion is immobile since too large to contribute to any ion transport itself. However, the anionic polymer significantly contributes to the selective transport of cations, since a stationary negatively charged path is created for the cations to move on. the polymers may for example be chosen from the group of polyacids or a salt of the polyacid (carboxylic, phosphoric, sulfonic), such as polystyrenesulfonic acid (PSSH), or blends thereof.

Likewise, selective ion transport in a second leg may be obtained by using a polymer capable of being cationic. Hence, the polymer backbone may comprise cationic moieties stabilized by anions. A polycation is an electrolyte wherein the ionic conductivity of cations is low compared to the ionic conductivity of anions. The polycation is hence a polymer having the cationic moieties; this ion is an essentially stationary ion, since a polymer is too large to be able to move through the electrolyte legs. However, the cationic polymer contributes to the selective transport of anions, since a positively charged path is created for the anions to move on. In this case, the polymer may for example be selected from the group of polymer with ammonium chloride in the pendant, such as poly((2-dimethylamino)ethylmethacrylate)methyl chloride quaternary salt (PMADQUAT), poly(allylamine hydrochloride) (PAH), poly(N-(3-aminopropyl)-N-(4-vinylbenzyl)-N,N-dimethylammonium chloride) (PAVDMA), or blends thereof.

According to one example, the electrolyte composition comprises a polyelectrolyte, nanoparticles comprising ionic groups or an ionic liquid. Using an electrolyte composition being a polyelectrolyte or an ionic liquid is advantageous as it allows the legs to be manufactured by printing or casting.

According to an embodiment said first electrolyte composition comprises an anionic polymer and/or said second electrolyte composition comprises a cationic polymer.

According to an embodiment said first electrolyte composition comprises a polymer selected from the group of polyacids or a salt of the polyacid, such as polystyrenesulfonic acid (PSSH), poly(3-carboxy-pentylthiophene) (P3PT-COOH) or blends thereof.

According to an embodiment said second electrolyte comprises a polymer selected from the group of polymer with ammonium chloride in the pendant, such as poly((2-dimethylamino)ethylmethacrylate)methyl chloride quaternary salt (PMADQUAT), poly(allylamine hydrochloride) (PAH), poly(N-(3-aminopropyl)-N-(4-vinylbenzyl)-N,N-dimethylammonium chloride) (PAVDMA) or blends thereof.

According to one example the Seebeck coefficient of the electrolyte is larger than 0.1 mV/K, or lager than 0.5 mV/K, or lager than 1 mV/K, or lager than 5 mV/K, or lager than 10 mV/K. Additionally or alternatively, the Seebeck coefficient of the electrolyte is lower than 1000 mV/K, or lower than 500 mV/K, or lower than 100 mV/K, or lower than 50 mV/K, or lower than 10 mV/K.

A polyelectrolyte may have a Seebeck coefficient between 1 mV/and 100 mV/K, or a Seebeck coefficient between 10 mV/K and 100 mV/K. The thermal conductivity may be between about 0.1 $Wm^{-1}K^{-1}$ and 1 $Wm^{-1}K^{-1}$ The figure of merit should preferably be larger than ZT=0.1 at room temperature (20-25° C.), more preferably larger than 0.3, more preferably larger than 0.5, even more preferably larger than 0.7, and yet more preferably larger than 0.8 at room temperature (20-25° C.). The ionic conductivity at room temperature should preferably be larger than 0.003 S/m.

Polyelectrolytes are commonly belonging to the group of charged membranes, or ion selective membrane or ion-exchange membranes. All of these membranes types are applicable in the thermoelectric device of the present invention.

By the term an ionic liquid, it is herein meant a salt in the liquid state, comprising ions.

According to one example, the electrolyte composition is hydrated or wetted. By hydrating or wetting the legs with the electrolyte composition, the transport of ions is eased as the electrolyte composition increases the electrical conductivity. The inventors also surprisingly found that the thermoelectric Seebeck voltage (related to the difference in temperature $\Delta T$ by a proportionality factor $\alpha$ called the Seebeck coefficient, or $V=\alpha\Delta T$) is very high and it significantly increases with increased humidity indicating that the effect is due to mobile ions. Hence, an increase in both conductivity and Seebeck coefficient leads to a large power factor.

The thermoelectric device of the present disclosure can also be seen as an ionic thermoelectric generator integrated to a supercapacitor in one device. With a temperature gradient $\Delta T>0$, the ionic thermoelectric power charges the supercapacitor. The charged supercapacitor can be discharged to release electrical energy only if $\Delta T=0$.

According to an embodiment the first and second electrodes comprise a material selected from high capacitance materials. By high capacitance materials is meant herein materials typically used in the electrodes of supercapacitors, e.g. in electrostatic (double layer), faradic (pseudo) or hybrid supercapacitors. In an electrostatic supercapacitor (layer of electronic charge on the metal electrode balanced by a layer of ions in the electrolyte) the electrodes should have a large surface area in order to maximize the electric double layer capacitance. In a faradic supercapacitor an electroactive surface layer is used. Such supercapacitor electrode materials typically have a specific capacitance in the range of 10 F/g to 1000 F/g. Thus, according to an embodiment first and second electrodes have a specific capacitance in the range of 10 F/g to 1000 F/g.

Examples of high capacitance materials useful in the electrodes of the thermoelectric device of the first aspect include materials having a large surface area and electrically conductive polymer compositions capable of being reduced and/or oxidized. By large surface area is meant herein materials having a specific surface area in the range of 50 $m^2/g$ to 5000 $m^2/g$.

There are three main classes of materials useful in the electrodes of the thermoelectric device of the first aspect, which can be used alone and/or combined in mixtures or composites: (1) carbon materials with high specific surface area, for example activated carbon, carbon aerogels, carbon nanotubes, templated porous carbons, carbon nanofibres and graphene networks; (2) conducting polymers, for example polyaniline, polypyrrole and polyethylene dioxythiophene, and (3) metal oxides, for example $RuO_2$, $IrO_2$, $MnO_2$, $NiO$, $Co_2O_3$, $SnO_2$, $V_2O_5$, and $MoO$.

According to an embodiment, the electrodes of the thermoelectric device comprise a carbon material having a specific surface area in the range of 50 $m^2/g$ to 5000 $m^2/g$, for example activated carbon, carbon aerogels, carbon nanotubes, templated porous carbons, carbon nanofibres or graphene networks. According to an embodiment, the electrodes of the thermoelectric device comprise a metal oxide, for example $RuO_2$, $IrO_2$, $MnO_2$, $NiO$, $Co_2O_3$, $SnO_2$, $V_2O_5$, or $MoO$. According to an embodiment, the electrodes of the thermoelectric device comprise an electrically conducting polymer.

In embodiments of the first aspect, the electrically conductive polymer compositions of the first and second electrodes comprise redox polymer compositions.

The conductive redox polymer composition may comprise PEDOT, poly(styrene sulphonate) (PSS), polyaniline and/or polypyrrole. Thus, the conductive polymer composition may comprise PEDOT-PSS, which may release cations and accept cations.

The conductive polymer may also be PEDOT-$ClO_4$ or PEDOT-Tos, in which the anions (coutnerion) is small and can leave the polymer electrodes.

Advantageously, the electrode may be composed of a metal electrode such as an Au electrode coated with the conductive redox polymer composition.

An alternative to the conductive redox polymer composition is high capacitance electrodes with a large surface area. Such high capacitance electrodes may be of materials such as porous carbon electrode aerogel, carbon nanotube network or metal nanoparticles.

The conductive polymers may be reversibly reduced and/or oxidized.

Hence, according to one example, the first electrically conductive polymer composition is capable of being reversibly reduced, and the second electrically conductive polymer composition is capable of being reversibly oxidized, or vice versa. This is advantageous as it enables to produce an electrical power when submitted to a temperature gradient (equivalent to charging a battery) and to produce an electrical power when no temperature gradient is applied anymore (equivalent to discharging the battery). Hence, the device can be used advantageously with alternative heat sources (e.g. the sun with days and nights). Hence, those devices can provide more constant electrical power versus time in case of alternative heat source and respond better the demand of human activities. Another aspect of this device is the possibility to alternately generate electric current, and generate a temperature difference (the equivalent to the battery discharge leads to a Peltier effect). In other words the device may first be used for generating electric current, thereafter for generating a temperature difference and thereafter for generating electric current etc.

In embodiments of the first aspect, the device is further comprising at least one ion reservoir at the junction between the electrolyte composition and the first and/or second electrodes.

According to an embodiment the thermoelectric device further comprises at least one ion reservoir at the junction between said first electrolyte composition and said first electrode and/or at the junction between said second electrolyte composition and said second electrode.

The ion reservoirs may comprise mobile ions. It is advantageous to use ionic reservoirs since it ensures a good ionic conductivity in the electrolyte, such as in polyelectrolyte legs. Further, the use of ionic reservoirs prevents any shortage of mobile ions.

As an example, there may be a first ion reservoir at the junction between the electrolyte composition and the first electrode, and there may be a second ion reservoir at the junction between the electrolyte composition and the second electrode.

According to one example, the first and second ion reservoirs comprise a salt, a wetted salt or a salt solution, preferably comprising inorganic ions. The inorganic ions should be monovalent, in other words carry one charge, in order to have the ability be transported by the first and second electrolyte composition, respectively, in the first and second leg, respectively, of the device.

As discussed above, by using an ion reservoir several advantages can be achieved. Firstly, the addition of a reservoir at or integrated with each of the electrodes permits more ions to flow through the polyelectrolyte legs. Lack of an ion reservoir, may result in a short life-time of the device as a continuous transport of ions is necessary for the production of continuous electric current. Secondly, the ion transport is essential for the electrochemical reaction to take place at the electrodes. Hence, by using ion reservoirs the reduction and oxidation on the respective electrode can be ensured.

In embodiments of the invention, the ion reservoirs may comprise a solid salt that slowly dissolves as ions thermodiffuse through the legs in order to preserve the ion concentration in the ion connector. The ionic reservoirs may also comprise a hygroscopic material.

In embodiments of the first aspect of the invention, the device is comprising more than one leg comprising an electrolyte. As an example, the device may comprise two legs, and ions may be transported between a connector to the first and second electrodes, respectively. This means that e.g. cations may be transported between the connector and the first electrode first via a first electrolyte in a first leg, whereas anions may be transported between the connector and the second electrode first via a second electrolyte in a second leg.

Thus, the applied temperature difference may be between the electrodes and the connector.

Thus, in embodiments of the first aspect, there is provided a thermoelectric device for generating electric current comprising a first leg connected to the first electrode and a second leg connected to the second electrode, wherein the first and second legs are coupled via a connector, wherein the first leg is connected to the first electrode by being in ionic contact, the second leg is connected to the second electrode by being in ionic contact, and the connector is in ionic contact with the first and the second legs; wherein the connector comprises a composition comprising mobile cations and mobile anions the device further comprises
- a first ion reservoir being in ionic contact with the first leg, and the first electrode and
- a second ion reservoir being in ionic contact with the second leg (and the second electrode, wherein the first and second ion reservoirs and the connector are spatially isolated from each other;

wherein the first leg comprises a first electrolyte composition being capable of transporting cations from the connector to the first ion reservoir, the second leg comprises a second electrolyte composition being capable of transporting anions from the connector to the second ion reservoir; and wherein the first electrode comprises a layer of a first electrically conductive polymer composition capable of being reduced which is in ionic contact with the first ion reservoir, and the second electrode comprises a layer of a second electrically conductive polymer composition capable of being oxidized which is in ionic contact with the second ion reservoir.

Consequently, when a temperature gradient or a temperature difference is imposed between the electrode and the connector, the ions in the connector may thermo-diffuse through the legs comprising an electrolyte composition towards the cold side and generates a measurable thermo-voltage.

According to an embodiment, said first electrically conductive polymer composition is capable of being reversibly oxidized, and said second electrically conductive polymer composition is capable of being reversibly reduced.

The electrochemically active electrode can be an inorganic material with ion and electron conductivity (for instance inorganic materials used for electrochromism); a conducting polymer with ion and electron conductivity; a non conducting polymer matrix comprising electrochemically active molecules or nanoparticles, dispersed in the non conducting polymer matrix, providing electrical conductivity; a non conducting polymer backbone with pendant group(s) that are electrochemically active molecules providing electrical conductivity; or any combination thereof.

In order to increase the ionic conductivity in the conducting polymer electrodes, an ionic channel of high conductivity in the electrodes may be included.

The connector may comprise a composition of mobile cations and mobile anions. As used herein, mobile cations and anions means that when applying a temperature gradient, the cations will move from the connector, through the first leg to the first ion reservoir and the anions will to move from the connector through the second leg to the second ion reservoir. The mobile cations and the mobile anions may possibly also move in the opposite direction, from the ion reservoirs to the connector, depending on the driving force. It is important that the material in the connector has a high conductivity for both anions and cations.

The ion reservoirs may form a place where the transported cations and anions can be collected. The first ion reservoir may be in ionic contact with the first leg, whereas the first electrode and a second ion reservoir may be in ionic contact with the second leg and the second electrode. The ion reservoirs can be arranged as an external storage place for the transported ions. The ion reservoirs can also be integrated in each leg at a distance from the connector or be integrated in each of the two electrodes.

The ion reservoirs may contain a hydroscopic material or a water solution in order to be able to collect high amount of salt.

According to one example, the concentration difference between the two reservoirs is initially low, preferably lower than 0.001%, or lower than 0.01% or lower than 0.02% or lower than 0.03%, or lower than 0.05%, or lower than 0.1%, or lower than 0.5%, or lower than 1%, or lower than 1.5%, or lower than 2%, or lower than 2.5%, or lower than 3%, or lower than 5%, or lower than 10%, with respect to the ions which are to be transported.

In embodiments of the invention, the first and/or second ion reservoirs and/or the connector further comprises a hygroscopic material In a preferred embodiment of the invention, the location of the ion reservoir is optimized in order to achieve an efficient accumulation of the mobile ions in the ion reservoirs and avoiding salt deposition in other parts of the device. For example, in embodiments of the invention the first ion reservoir may be arranged in direct contact with the first electrode and in direct contact with the first leg, while there is a space between the first electrode and the first leg. Thereby, the first electrode and first leg are in indirect ionic contact via the first ion reservoir. Likewise, the second ion reservoir may be arranged in direct contact with the second electrode and in direct contact with the second leg, while there is a space between the second electrode and the second leg. Thereby, the second electrode and second leg are in indirect ionic contact via the second ion reservoir. This is beneficial since some conducting polymer electrode possesses a polyelectrolyte and thus have a selective ion motion, this would cause difficulties for the mobile ion to enter the electrode and/or difficulties for the counter ion to leave the electrode. This would result in unfavorable salt deposition i.e. the formation of solid salt particles in the interface between the electrodes and the legs which could hinder ionic transport. This could cause the ionic thermoelectric effect to decrease or even stop.

The ion reservoirs should advantageously be arranged forming an interface between each of the electrodes and each of the legs.

In more detail, the first electrolyte composition may comprise an anionic polymer; and/or the second electrolyte composition may comprise a cationic polymer. This is advantageous, as the ion transport can be controlled so that charge cancellation, resulting from movement of both anions and cations in the same leg, is avoided.

According to one example, the first and/or second electrolyte composition is a composite made of the polyelectrolyte and a neutral matrix favoring ionic motion. The neutral matrix can be a liquid solvent or a solid solvent, such as succinonitrile or polyethyleneoxide.

According to one example, the electrically conductive polymer compositions of the first and second electrodes comprise redox polymer compositions. when the ions are transported from the ions connector to reservoir, a reduction of the redox polymer composition is induced at the first electrode, while at the second electrode an oxidation reaction is reduced in the second electrode. Thereby, an electric potential and electric current is achieved in an external circuit.

The hygroscopic material in the connector is advantageous when water is used as a solvent to wet the polyelectrolyte and the connector. Using a hygroscopic material help to more easily keep the water in the device and to prevent it from evaporating. Thereby, the water molecules absorbed in the hydroscopic material screen the charge of the ions by building a solvation shell around each ion. As a result, the electrostatic attraction between the mobile cations and anions weakens and the activation energy for the ion transport decreases. Increasing further the humidity leads to the creation of water percolation paths, the film is wet, and the ionic conductivity tends to saturate towards the ionic conductivity of the liquid phase. Therefore, the first and/or ion reservoirs and/or the connector may also comprise a salt solution. Any known hygroscopic salt could be favorable. Any known hygroscopic salt introduced in a polymer matrix could also be favorable. A non-limiting example is NaCl in a polyethyleneoxide matrix.

According to one example, the connector may comprise a salt, a wetted salt, a salt solution, salt in a polymer matrix and/or an ionic liquid, preferably comprising inorganic ions.

Alternatives to water as solvent are polar high boiling point solvents, such as propylene carbonate, DEG (diethylene glycol), PEG (polyethylene glycol) or other non volatile materials such as ionic liquid, succinonitirle, as such or gellified with a polymer.

By using the principle of ionic transport instead of the conventional electric current principle, thermoelectric materials based on organic materials can be used. This provides the possibility for producing the assembly using printing techniques.

According to an embodiment said first electrode, second electrode, first electrolyte composition, second electrolyte composition and/or connector can be applied by liquid deposition techniques.

According to an embodiment the thermoelectric device is arranged on a flexible solid substrate.

In an embodiment, both the connector and the ion reservoirs may comprise mobile ions.

As discussed above, the device may further be adapted to generate a temperature difference as a response to an applied voltage between the electrodes.

In embodiments of the invention, there is provided a thermoelectric device for generating a temperature difference comprising a first leg connected to the first electrode and a second leg connected to the second electrode, wherein the first and second legs are coupled via a connector, wherein the first leg is connected to the first electrode (102) by being in ionic contact, and the second leg is connected to the second electrode by being in ionic contact;
the device further comprises
a first ion reservoir comprising mobile cations, being in ionic contact with the first leg, and the first electrode and
a second ion reservoir comprising mobile anions, being in ionic contact with the second leg and the second electrode,
wherein the first and second ion reservoirs and the connector are spatially isolated from each other; wherein the first leg comprises a first electrolyte composition being capable of transporting cations from the first ion reservoir to the connector the second leg comprises a second electrolyte composition being capable of transporting anions from the second ion reservoir to the connector;
wherein the connector comprises a cation and anion transporting composition in ionic contact with the first and the second legs; and wherein the first electrode comprises a layer of a first electrically conductive polymer composition capable of being oxidized which is in direct contact with the first ion reservoir, and the second electrode comprises a layer of a second electrically conductive polymer composition capable of being reduced which is in direct contact with the second ion reservoir.

In an embodiment, both the connector and the ion reservoirs may comprise mobile ions.

According to an embodiment, said first electrically conductive polymer composition is capable of being reversibly reduced, and said second electrically conductive polymer composition is capable of being reversibly oxidized.

Further, the first and second ion reservoirs may comprise a salt, a wetted salt or a salt solution, preferably comprising inorganic ions.

Moreover, the connector may comprise a salt, a wetted salt, or a salt solution, salt in polymer matrix, ionic liquid preferably comprising inorganic ions.

As an example, the first and/or second ion reservoirs and/or the connector further comprises a hydroscopic material.

Furthermore, the first electrolyte composition may comprise an anionic polymer and/or the second electrolyte composition may comprise a cationic polymer.

It is also to be understood that in the embodiments in which the device comprises a first and a second leg, the electrolyte composition may comprise a polyelectrolyte, nanoparticles comprising ionic groups and/or an ionic liquid.

As an example, the first electrolyte composition may comprise a polymer selected from the group of polyacids or a salt of the polyacid, such as polystyrenesulfonic acid (PSSH), poly(3-carboxy-pentylthiophene) (P3PT-COOH) or blends thereof.

Furthermore, the second electrolyte may comprise a polymer selected from the group of polymer with ammonium chloride in the pendant, such as poly((2-dimethylamino) ethylmethacrylate)methyl chloride quaternary salt (PMADQUAT), poly(allylamine hydrochloride) (PAH), poly(N-(3-aminopropyl)-N-(4-vinylbenzyl)-N,N-dimethylammonium chloride) (PAVDMA) or blends thereof.

In embodiments of the first aspect, the second electrolyte composition is hydrated or wetted.

In embodiments of the first aspect, the electrically conductive polymer compositions of the first and second electrodes comprises redox polymer compositions.

As previously discussed, conductive polymer composition may comprise PEDOT, poly(styrene sulphonate) (PSS), polyaniline and/or polypyrrole.

Further, the first and second ion reservoirs may comprise a salt, a wetted salt or a salt solution, preferably comprising inorganic ions.

In embodiments, the connector comprises a salt, a wetted salt, or a salt solution, salt in polymer matrix, ionic liquid preferably comprising inorganic ions.

In embodiments, the first and/or second ion reservoirs and/or the connector further comprises a hydroscopic material.

As a second aspect of the invention, there is provided a thermoelectric assembly comprising a thermoelectric device according to any aspect above in which the device is comprising a first and a second leg, a connector, a first and second ion reservoir, and further,
a third leg,
a fourth leg,
and an additional connector, wherein
the connector of the thermoelectric device is separated into a first connector portion and a second connector portion, which connector first and second connector portions are spatially separated from each others;

the first leg of the thermoelectric device is connected to the first connector portion;

the second leg of the thermoelectric device is connected to the second connector portion;

a third leg ionically connecting the first connector portion and the additional connector, which leg comprises a third electrolyte composition being capable of transporting anions from the first connector portion to the additional connector;

a fourth leg ionically connecting the second connector portion and the additional connector, which leg comprises a fourth electrolyte composition being capable of transporting cations from the second connector portion to the first ion reservoir.

As a third aspect of the invention, there is provided a method for generating electric current comprising the steps of:

providing a thermoelectric device according to any aspect above, and applying a temperature difference over the electrolyte composition.

Advantageously, the method for generating electric current according to the present invention may be used in waste heat management, also when dealing with waste heat in warm fluids (50-250° C.), available in industry, electricity production, buildings and transport. Also, when considering renewable energy sources, such as solar cells, the method may be used to increase the efficiency by using heat that is conventionally lost.

In embodiments, the method is comprising, providing a thermoelectric device or assembly as defined above in which in which the device is comprising a first and a second leg, a connector, a first and second ion reservoir, and providing a first temperature in the connector and a second temperature in the first and second ion reservoirs, wherein the first temperature is lower than the second temperature.

As a fourth aspect of the invention, there is provided a method for generating a temperature difference comprising the steps of:

providing a thermoelectric device according to any aspect above, and applying a potential difference between the electrodes.

In embodiments, the method is comprising providing a thermoelectric device or assembly as defined above in which the device is comprising a first and a second leg, a connector, a first and second ion reservoir, and, and applying a potential difference between the first and second electrodes.

As a fifth aspect of the invention, there is provided the use of a thermoelectric device or assembly according to any aspect above as a temperature sensor, or for charging a capacitor.

As a sixth aspect of the invention, there is provided the use of a polymeric electrolyte as an ion transporting material in a thermoelectric device. According to an embodiment the use of a composition comprising a hydrated or wetted polymer composition as an ion transporting material in a thermoelectric device, wherein the a polymer is capable of being anionic or a polymer capable of being cationic. The polymeric electrolyte of the sixth aspect of the invention can be further defined as described above with reference to the previous embodiments.

As a seventh aspect of the invention, there is provided the use of a conductive polymer composition in the electrodes of a thermoelectric device. The conductive polymer composition of the seventh aspect of the invention can be further defined as described above with reference to the previous embodiments.

BRIEF DESCRIPTION OF THE DRAWINGS

Embodiments of the invention will now be described, by way of example, with reference to the accompanying drawings, wherein:

FIG. 3 shows a schematic drawing of a device used for measuring the example devices.

FIG. 4a shows the ion flow direction in vertical device.

FIG. 4b shows the ion flow direction in lateral device.

FIGS. 15a and 15b show a further schematic drawing of some of the components of a thermoelectric generator according to the invention (FIG. 15a) and an example on a multilegged device (FIG. 15b).

DETAILED DESCRIPTION

Schematic Description of a Thermoelectric Generator with a Single Leg

Figure 16:
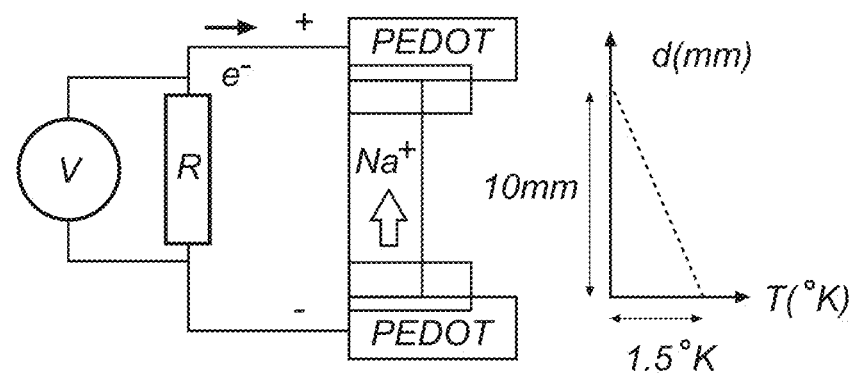
FIG. 16 shows a single-leg PSSNa ionic thermoelectric generator.

A schematic drawing of an thermoelectric device having a single leg is shown in FIG. 16. The single leg comprising a polyelectrolyte is arranged between two electrodes (PEDOT) comprising a conducting polymer. An applied temperature difference between the electrodes drives ions in the single leg towards one of the electrodes (in this case the "upper" electrode in FIG. 16). In order to transform the ionic current generated in the polyelectrolyte leg into an electronic current in the external circuit, an electrochemical reaction is required at the electrodes. For this purpose, a conducting polymer, more especially PEDOT-PSS, is used as electrodes since such material transports both electronic and ionic charge carriers. Importantly, a conducting polymer, typically oxidized, possesses a vanishingly small band gap and thus undergoes an electrochemical reaction a very small applied voltage. For this reason, conducting polymers are used as electrode in supercapacitors. Here, we expect that the electric potential difference between two electrodes due to the thermo-diffusion of ions in the polyelectrolyte induces an electrochemical reaction at the conducting polymer electrodes. For the polyanion PSSNa, the cations thermo-diffuses to the cold PEDOT-PSS electrode and increase its electrostatic potential, which triggers a reduction of the conducting polymer with an electron coming from the external circuit:

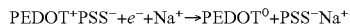

$$PEDOT^+PSS^- + e^- + Na^+ \rightarrow PEDOT^0 + PSS^- Na^+$$

At the hot electrode, the oxidation of PEDOT-PSS is the opposite direction of the chemical equation. Both reduction and oxidation are possible at the PEDOT-PSS electrodes because the polymer is not fully oxidized in its pristine conducting form. In order to ensure a good ionic conductivity in the polyelectrolyte legs, as well as no limitation due to the amount of mobile cations, two reservoirs of equal NaCl salt concentration are added at the junctions between the PEDOT-PSS electrodes and the polyanion. The reservoirs are designed with PDMS and filled in with an electrolytic gel made of 10% of polyethyleneoxide (Mw=100,000) and an aqueous solution of NaCl (1 M).

Figure 17:
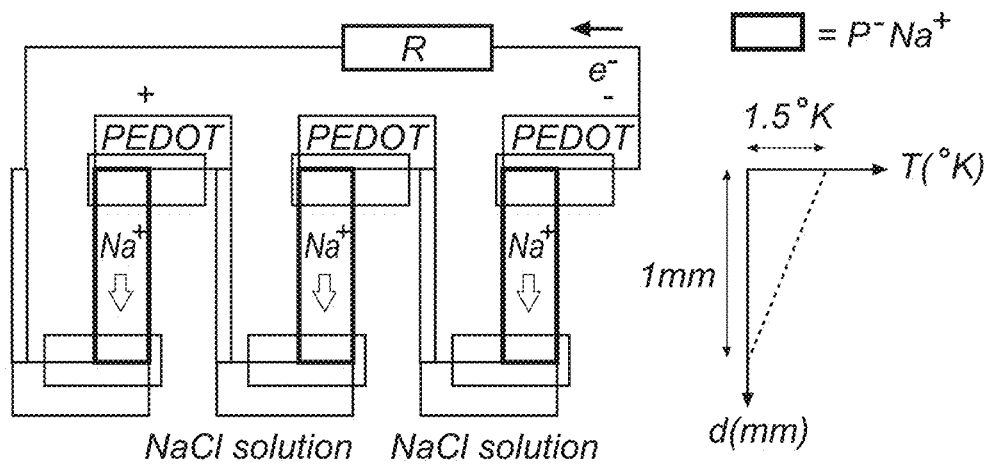
FIG. 17 shows electrically coupled single-leg PSSNa ionic thermoelectric generators.

For some applications that do not require lot of current but rather a high voltage, it could be advantageous to couple single leg generators electrically, e.g. via a metal or a conducting polymer, see FIG. 17. The single-leg ionic TEG may thus be connected thermally in parallel and electrically in series by bridging the top-electrode of a single-leg ionic TEG with the bottom electrode of the adjacent single-leg ionic TEG via electronic conductor (no need of ionic conduction) preferably of low thermal conductivity and high electrical conductivity (e.g organic conductor such as PEDOT-Tos, polyaniline-CSA, charge transfer salt).

Such application could be for instance to switching a transistor by applying a voltage via the thermoelectric voltage. The transistor is switched OFF or ON depending on the temperature gradient.

Schematic Description of a Thermoelectric Generator with Two Legs

Figure 1:
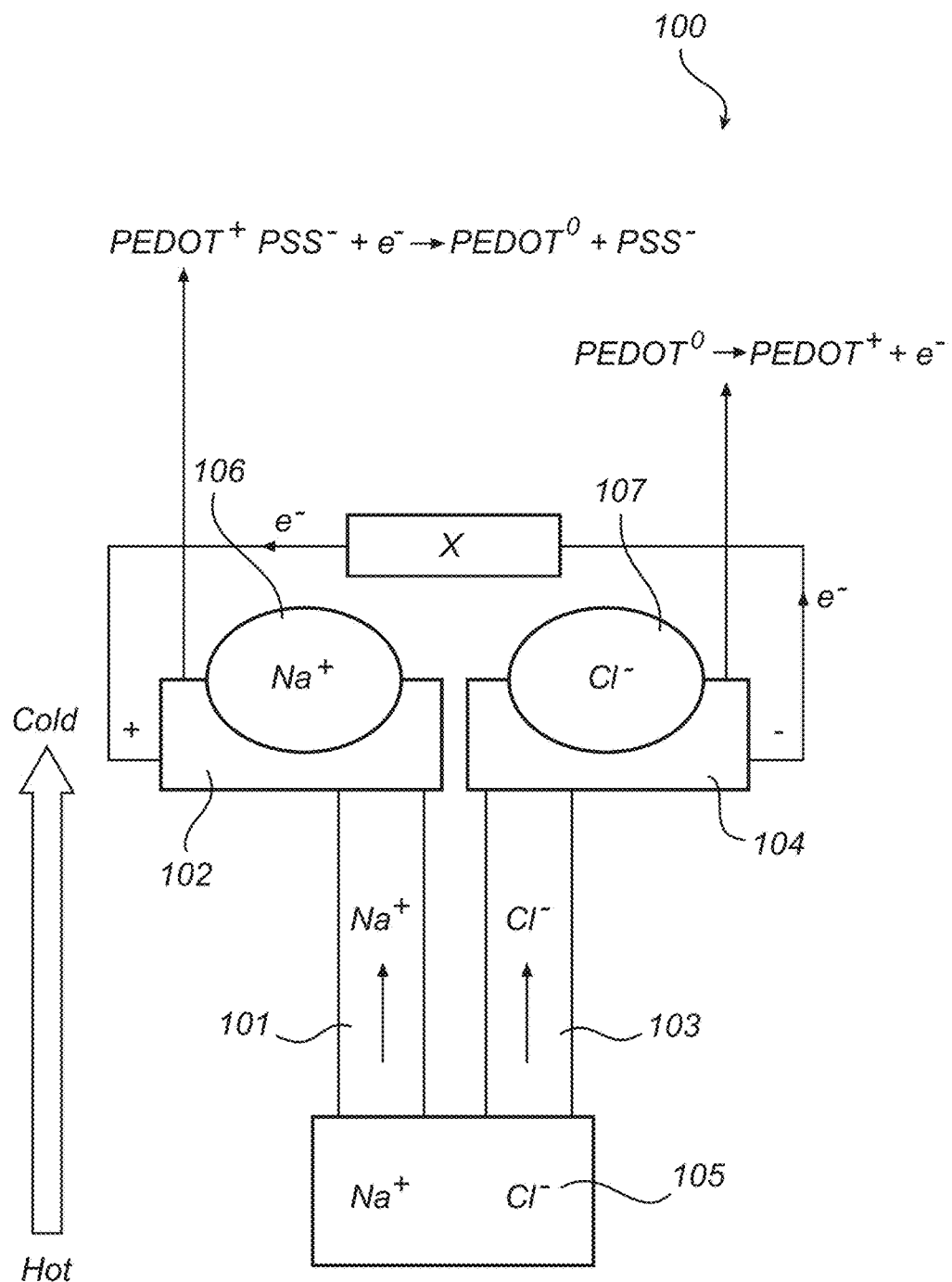
FIG. 1 shows a schematic drawing of a thermoelectric generator according to the invention.

FIG. 1 shows a thermoelectric generator (TEG) (100) according to the invention which comprises a first leg (101) connected to a first electrode (102) and a second leg (103) connected to a second electrode (104), wherein said first and second legs are coupled via a connector (105). In contrast to prior art, the TEG in FIG. 1 is based on the principle of ion transport. It is to be understood that this drawing is non-limiting. For example, the ion reservoirs 106 and 107 may be positioned anywhere as long as they are in ionic contact with the first 101 and second leg 103, respectively.

When applying a temperature gradient, the cations will move from the connector (105), through the first leg (101) to the first ion reservoir (106) and the anions will to move from the connector (105) through the second leg (103) to the second ion reservoir (107)

The first and second legs (101,103) comprise electrolyte compositions. The first leg (101) comprises a first electrolyte composition being capable of transporting cations from said connector (105) to said first ion reservoir (106). Said second leg (103) comprises a second electrolyte composition being capable of transporting anions from said connector (105) to said second ion reservoir (107). The electrolyte may be based on a polyelectrolyte, an ionic liquid, a macromolecule functionalized with an ionic group or a nanoparticle functionalized with an ionic group.

The first and second electrodes (102,104) comprise a composition capable of transforming the ion transport into an electron transport. This is done by using a first electrode (102) comprising a layer of a first electrochemically active material, more especially an electrically conductive polymer composition capable of being reduced, which is in ionic contact with said first ion reservoir (106). Further, said second electrode (104) comprises a layer of a second electrically conductive polymer composition capable of being oxidized which is in ionic contact with said second ion reservoir. It is critical that electrode compositions are electrically conductive and electrochemically active.

According to one example, the electrodes may be composed of a metal electrode such as an Au electrode coated with the conductive polymer composition capable of being oxidized or the conductive polymer composition capable of being reduced. Preferably, the first and second electrodes comprise redox polymer compositions, such as PEDOT, PSS, polypyrol and/or polyaniline.

The connector (105) comprises a composition of mobile cations and mobile anions. As used herein, mobile cations and anions means that when applying a temperature gradient, the cations will move from the connector (105), through the first leg (101) to the first ion reservoir (106) and the anions will to move from the connector (105) through the second leg (103) to the second ion reservoir (107). The mobile cations and the mobile anions may possibly also move in the opposite direction, from the ion reservoirs to the connector, depending on the driving force. It is important that the material in the connector has a high conductivity for both anions and cations.

The ion reservoirs (106,107) are used in the TEG in FIG. 1 in order to form a place where the transported cations and anions can be collected. The first ion reservoir (106) is in ionic contact with the first leg (101), and the first electrode and a second ion reservoir (107) is in ionic contact with the second leg (103) and the second electrode. The ion reservoirs can be arranged as an external storage place for the transported ions. The ion reservoirs can also be integrated in each leg at a distance from the connector or be integrated in each of the two electrodes.

In order to achieve the desired ion transport, it is a requirement that that the first ion reservoir, the first electrode, the first leg, and the connector are arranged to allow direct or indirect ion transport from the connector to the first ion reservoir via the first leg. Likewise, the second ion reservoir, the second electrode, the second leg, and the connector are also arranged to allow direct or indirect ion transport from the connector to the second ion reservoir via the second leg. Hence, said first and second legs are both in ionic contact with the connector.

However, it should be noted that ion transport between the first and second ion reservoirs, between the first and second electrode, and between the first and second legs should be avoided since this would affect the thermoelectric effect of the TEG. For the same reason, the first and second ion reservoirs (106,107) and said connector (105) are spatially isolated from each other. This allows for ion transport between the cold side (electrodes and ion reservoirs) and the hot side (the connector) of the thermoelectric generator.

In FIG. 1, the TEG produces an electric current when the device is exposed to a temperature gradient, where the temperature is higher in the connector than in the electrodes and ion reservoirs. The heat flow is inducing a transport of ions where the ions inside the connector (hot side) tend to move towards the distal part of the legs (cold side). This is called the thermodiffusion or Soret effect. The temperature gradient is hence the driving-force for the ion transport. Therefore, ions will be a transported from the connector to the ion reservoirs.

When an electrolyte composition in the first leg allowing more cations than anions to be transported is used in combination with an electrolyte composition in the second leg allowing more anions than cations to be transported, this does in itself not result in a continuous ion transport as it would not be possible to maintain charge-balance in the ion reservoir. The inventors have found a way to collect the transported ions in the ion reservoir and achieving charge-balance and at the same time convert the ionic transport to an external electric current.

In FIG. 1, a first electrode capable of undergoing a reduction reaction and a second electrode capable of undergoing an oxidation reaction are used. In the reduction reaction anions can be produced and in the oxidation reaction cations and electrons are produced.

As an example, PEDOT may be reduced at one of the electrodes and an immobile polyanion PSS may be produced, wherefrom a cation may arrive to balance. At the other electrode, PEDOT may be oxidized, due to that anions may arrive close to the PEDOT-PSS electrode but may not go into it since PSS is an immobile polyanion. Hence, instead, the anions may stay in the ion reservoir close to the electrode and the mobile cations, normally balancing the polyanion PSS in the electrode, may also move into the reservoir. The lack of cations in the electrode or the excess of PSS immobile polyanions may therefore lead to the oxidation.

The reduction and oxidation reactions are initiated due to the thermodiffusion, because in order for the transport to occur for prolonged times simultaneous production of counter-ions in the electrodes is needed in order to balance the transported cations entering the first ion reservoir and to balance anions entering the second reservoir. Hence, as the mobile cations arrive in the first ion reservoir, charge-balance is obtained by anions formed in the reduction reaction. Similarly, as the mobile anions arrive in the second ion reservoir, charge-balance is obtained by a cation formed in or released due to the oxidation reaction. Thereby, a continuous flow of mobile cations and anions from the connector to each of the reservoirs, respectively, is created. Due to the oxidation and reduction reactions, an external electrical current may be produced in a connected electronic circuit as the oxidation results in free electrons and as electrons are needed for the reduction to take place.

The ion transport is a result of thermodiffusion initiated by the temperature gradient present as described above. However, the degree of ion transport is further controlled by for example the ion size of the counter ions in the electrolyte compositions, the ion size and charge of the ion reservoirs, and the structure of any polymers present in the electrolyte compositions, such as the use of substituents, degree of cross-linking, amount of ionic groups etc. This is because the maximum transport rate is limited to the rate of which ions can be transported from the reservoirs to the connector through the electrolyte composition and the energy barriers for reduction and oxidation in the electrodes. Below, different ways of controlling the transport rate is discussed.

In detail, a requirement of achieving ion transport from the ion reservoirs is that the cations and anions of the ion reservoirs have sufficiently small ion radius to be able to move through the electrolyte compositions. Hence, the ion reservoirs should comprise mobile cations and anions, respectively. Since a polymer composition in general is a very porous structure, inorganic ions, preferably monovalent inorganic ions such as $H^+$, $Li^+$, $Na^+$, $Cl^-$, $Br^-$, $I^-$, $ClO_4^-$, may move through the electrolyte compositions. Preferably, ions that are not electrochemically active themselves should be used. Some organic ions are also considered to be sufficiently mobile. However, organic ions having more than 15 carbon atoms, preferably not more than 10 carbon atoms, more preferably not more than 5 carbon atoms, would not be realistic to use, since they become too big and too slow to transport.

Preferably, the ion concentration in the connector may be about the same as the ion concentration in the ion reservoirs.

It is also advantageous that the ions are easily leaving the connector. This is achieved by using salts which easily dissociate or which are in a more or less dissociated form. This can be facilitated by using a hydrated or wetted salt, a hygroscopic salt, which form solvated shells around the ions. Another way of obtaining freely movable ions is to use a solution of salt as ion reservoir. Another alternative is to use polar high boiling point solvents, such as propylene carbonate, diethlyene glycol, DEG, PEG or other non volatile materials such as an ionic liquid, succinonitrile, as such or gellified with a polymer.

Further, the ionic contact between the reservoirs and the legs is of importance. In order to achieve high degree of contact, the ion reservoir may be integrated with the electrolyte composition of the leg.

Further, it is advantageous to provide the cationic and anionic polymer with counter ions, which are small and have easily leaving groups to facilitate the ion transport.

Further, the reactivity of the reduction and oxidation agents in the electrodes will influence the transport rate. The electrode may comprise of electrochemically material that conduct both ions and electronic charge carriers. The electrode has advantageously a small band gap in order to undergo an electrochemical reaction for very small voltage, such as the thermo-voltage produced by Soret effect of ions in a polyelectrolyte. Hence, the electrode should undergo a thermo-induced electrochemical reaction Furthermore, the ion transport may be significantly controlled by adding different additives, for instance polar high boiling point solvents, such as propylene carbonate, diethlyene glycol, DEG, PEG or other non volatile materials such as an ionic liquid, succinonitrile, as such or gellified with a polymer, or zwitter ions, to the electrolyte composition. The inventors have found that the ion transport was significantly enhanced by adding water to the electrolyte composition. Preferably, the water is added to the ion reservoirs and/or the connector, and thereafter it may penetrate into the legs by osmosis. The electrolyte compositions in the legs may comprise up to more than 50% of water regarded to its volume. The addition of water to the electrolyte composition results in that the ions are solvated. As a result, the electrostatic attraction between the mobile ions and the polyions weakens and the activation energy for the ion transport decreases. Increasing further the humidity leads to the creation of water percolation paths, the film is wet, and the ionic conductivity tends to saturate towards the ionic conductivity of the liquid phase. In preferred embodiments of the invention, the first and/or second electrolyte composition is hydrated or wetted. Advantageously, a hygroscopic material can be included in the electrolyte compositions in order to keep the leg hydrated/wetted for prolonged time. Alternatively, a solution of salt can be used as ion reservoirs and connector.

The present invention further relates to a thermoelectric device for producing a temperature gradient or temperature difference.

Figure 2:
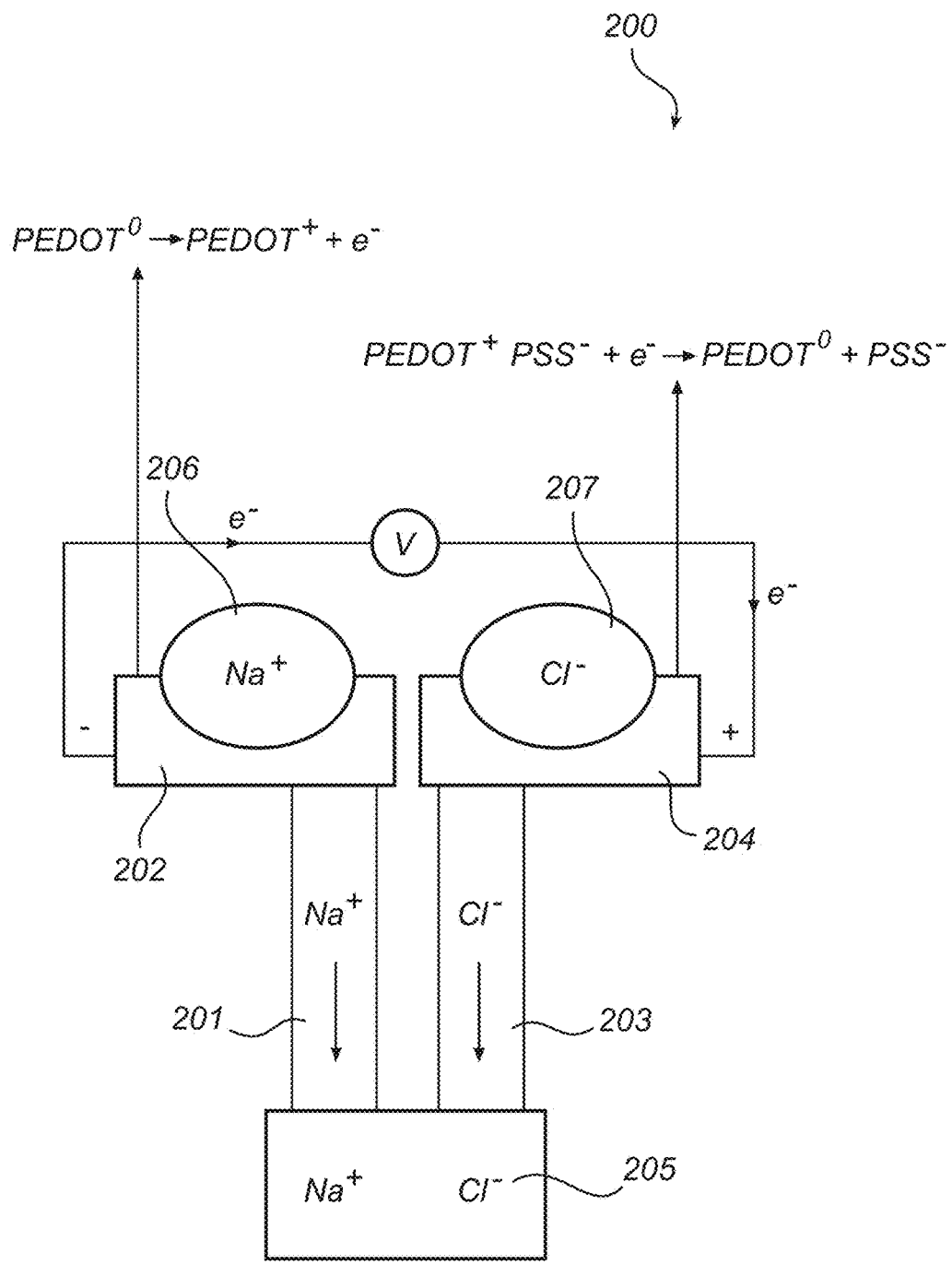
FIG. 2 shows a schematic drawing of a thermoelectric cooler according to the invention.

FIG. 2 shows a thermoelectric device for producing a temperature gradient or temperature difference (200) according to the invention which comprises a first leg (201) connected to a first electrode (202) and a second leg (203) connected to a second electrode (204), wherein said first and second legs are coupled via a connector (205). In contrast to prior art, the device in FIG. 2 is based on the same principle as the thermoelectric device in FIG. 1, namely the utilization of ion transport as charge carriers. Therefore, the device is built on the same general concept as the TEG in FIG. 1 acceding to the invention with some modifications and differences explained below.

In analogy with the device described in FIG. 1, said first leg (201) is connected to said first electrode (202) by being in ionic contact, and said second leg (203) is connected to said second electrode (204) by being in ionic contact. Further, the thermoelectric cooler also comprises a first and second ion reservoir where said first ion reservoir (206) is in ionic contact with said first leg (201) and said first electrode and said second ion reservoir (207) is in ionic contact with said second leg (203) and said second electrode. Furthermore, said first and second ion reservoirs (206,207) and said connector (205) are spatially isolated from each other.

However, in the thermoelectric device in FIG. 2, the first ion reservoir (206) comprises mobile cations, and said second ion reservoir (207) comprises mobile anions which are transported from the ion reservoirs to the connector via the first and second leg. Therefore, said first leg (201) comprises a first electrolyte composition being capable of transporting cations from said first ion reservoir (206) to said connector (205), said second leg (203) comprises a second electrolyte composition being capable of transporting anions from said second ion reservoir (207) to said connector (205). The mobile ions are then collected in the connector of the device so that charge-balance is obtained. The connector therefore comprises a cation and anion transporting composition in ionic contact with said first and said second legs.

Another difference is that said first electrode (202) comprises a layer of a first electrically conductive polymer composition capable of being oxidized which is in direct contact with said first ion reservoir (206), and said second electrode (204) comprises a layer of a second electrically conductive polymer composition capable of being reduced which is in direct contact with said second ion reservoir.

In FIG. 2, a voltage is applied over the electrodes, which initiates an oxidation reaction in the first electrode as the electrode becomes depleted in electrons. Thereby, cations are produced in the first leg. Similarly, a reduction reaction takes place in the second leg due to excess amount of electrons in the second electrode. Thereby anions are produced in said second electrode. The oxidized electrode therefore produces an excess amount of cations and the reduced electrode produces an excess amount of negative ions. This results in the movement of excess ions through each leg of the device to the connector. The driving-force of the ion transport is to obtain charge-balance of the system. This is achieved since by the transport the excess cation and excess anion are collected which results in charge neutralization.

If the potentials at the electrodes are reversed compared to a reference state, the ion motion becomes the opposite in both legs. As the ions may transport heat, an ion motion in the opposite direction implies an inverse heat flow compared to the heat flow in the reference state.

Schematic Description of a Thermoelectric Generator with Multiple Legs

Figure 12:
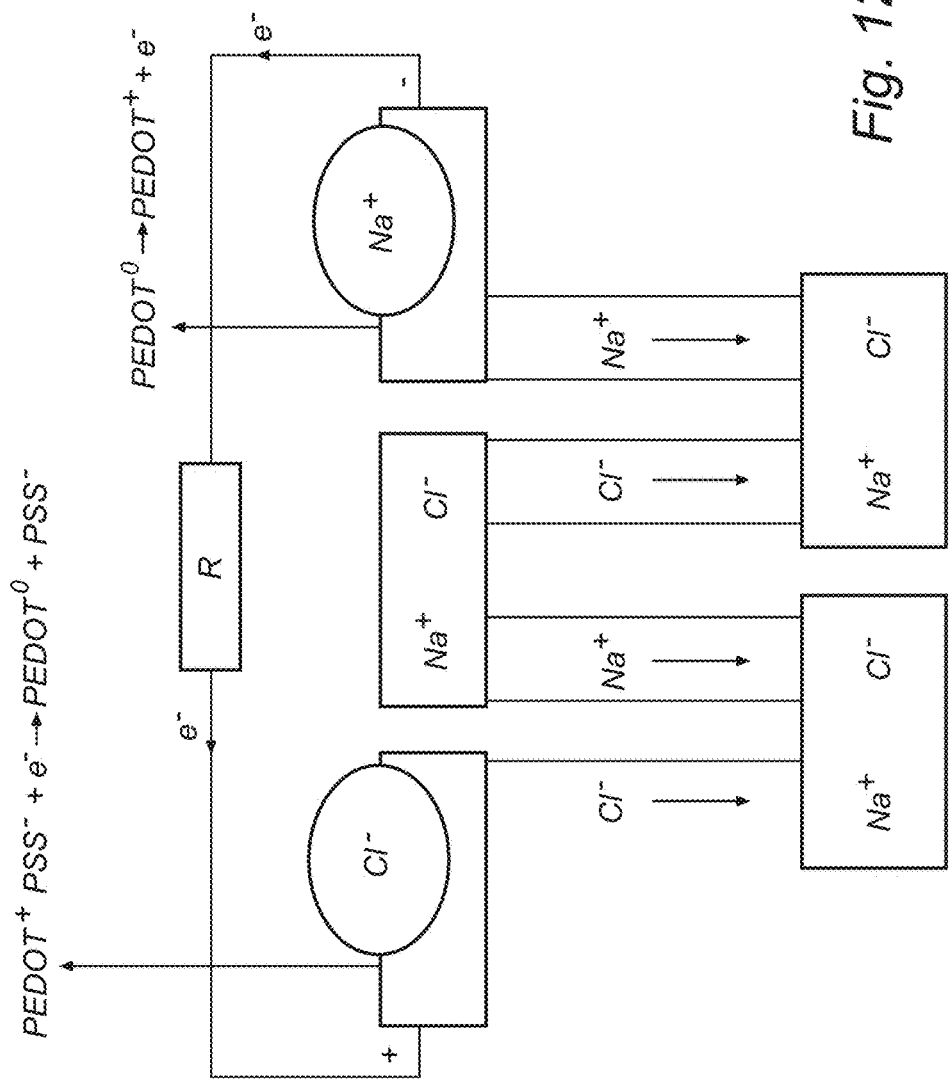
FIG. 12 shows a schematic drawing of an embodiment of a multilegged device according to the invention.
Figure 13B:
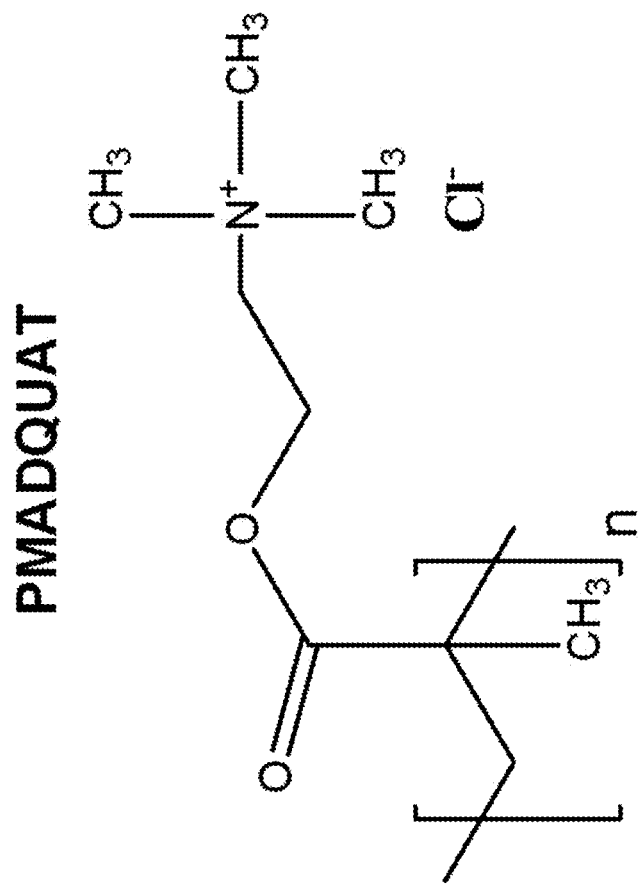
FIGS. 13a and 13b show the chemical structure of PSSNa and PMDQUAT, respectively.
Figure 13A:
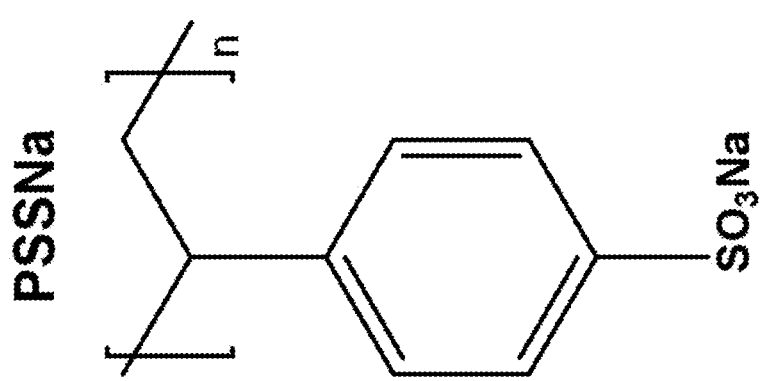

FIG. 12 shows a multilegged thermoelectric assembly, i.e. a thermoelectric assembly comprising more than one pair of legs. The multilegged thermoelectric assembly is arranged as described in relation to the device above, except that there are two more connectors and two more legs. The first leg is arranged of a cation transporting material, and ionically connects said first ion reservoir and a first one of said connectors; the second leg is arranged of an anion transporting material, and ionically connects said first one of said connectors and a second one of said connectors; the third leg is arranged of a cation transporting material, and ionically connects said second one of said connectors and a third one of said connectors; the fourth leg is arranged of an anion transporting material, and ionically connects said third one of said connectors and said second ion reservoir.

When a temperature difference or a potential difference is applied, an electric current or a temperature difference, respectively is produced an analogy with the description above. Providing a multilegged device is advantageous, as a higher voltage can be produced by the same temperature difference.

Naturally, the device may be extended by further connectors and pair of legs

Dimensions

The thermoelectric device according to the present invention may have various dimensions.

The efficiency of a thermoelectric device depends on more factors than only the maximum ZT of a material. This is primarily due to the temperature dependence of all the materials properties (ionic conductivity, $\sigma$, ionic Seebeck coefficient, $\alpha$, and thermal conductivity, $\lambda$) that make up ZT(T) as a function of temperature.

A small letter "z" is used for the figure-of-merit of a thermoelectric device in order to distinguish it from the material's figure of merit $ZT=\alpha^2\sigma/\lambda$. The maximum efficiency ($\eta$) of a thermoelectric device is used to determine zT. Like all heat engines, the maximum power-generation efficiency of a thermoelectric generator is thermodynamically limited by the Carnot efficiency ($\Delta T/T_h$). If the temperature is assumed to be independent and n-type and p-type thermoelectric properties are matched ($\alpha$, $\sigma$ and $\kappa$), (an unrealistic approximation in many cases) the maximum device efficiency is given by Equation (1) with Z=z.

$$\eta = \frac{\Delta T}{T_h} \cdot \frac{\sqrt{1+zT}-1}{\sqrt{1+zT}+\frac{T_c}{T_h}} \qquad \text{Eq. (1)}$$

In order to obtain the maximum efficiency of the TEG, dimensions of the legs need to be optimized such that the lengths $L_n$ and $L_p$ and the cross section areas $S_n$ and $S_p$ of the legs satisfy the Equation (2), wherein n stands for n-type and p stands for p-type. The lengths $L_n$ and $L_p$ are the lengths of the legs extending from the cold side to the hot side. The cross section areas $S_n$ and $S_p$ of the legs are the cross section areas through which the ions are moving when they diffuse by the temperature difference along the lengths of the legs.

$$\frac{I_n S_p}{I_p S_n} = \left(\frac{\sigma_n \lambda_n}{\sigma_p \lambda_p}\right) \quad \text{Eq. (2)}$$

As far as the device architecture is concerned, miniaturization is known to improve the efficiency of Peltier coolers (large heat flow).

Figure 14:
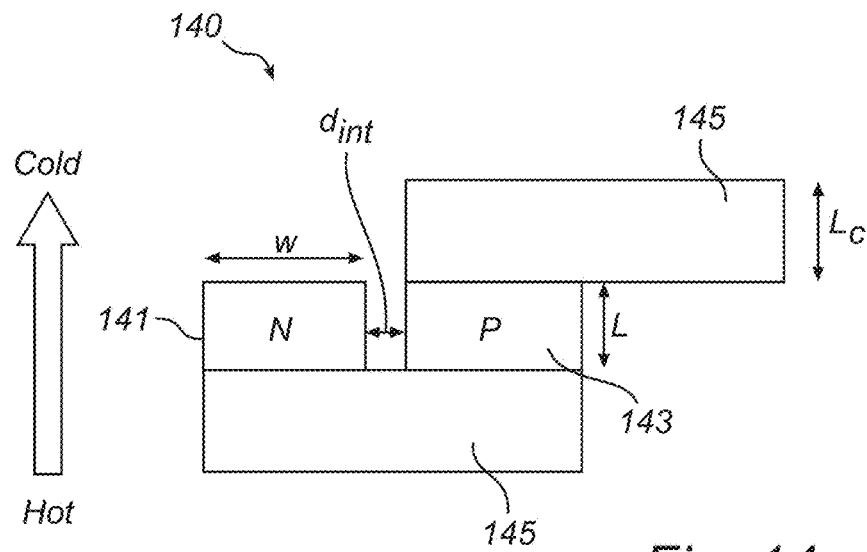
FIG. 14 shows a schematic drawing of some of the components of a thermoelectric generator according to the invention.

In the following, reference is made to FIG. 14, which shows a schematic drawing of some components of thermoelectric device 140 comprising connectors 145 ionically coupled via legs 141 and 143. The legs 141 and 143 of the device may be provided as a film comprising the electrolyte composition. The thickness of the film of electrolyte composition L in the legs may vary. The thickness of the film, i.e. length L, may be in the range of from 1 nm to 5 dm, for instance in the range of from 10 nm to 5 cm, or from 10 μm to 5 mm, such as in the range of from 1 nm to 500 μm, as for example in the range of from 10 μm to 500 μm, such as in the range from 50 μm to 500 μm, or in the range of from 1 nm to 10 μm, such as in the range from 1 nm to 1 μm.

If screen printing is used, the film of electrolyte composition, i.e. length L, may be in the range of from 1 μm to 500 μm. If spin coating is used, the film of electrolyte composition may be in the range of from 1 nm to 10 μm. If liquid handling robot is used, the film of electrolyte composition may be in the range of from 1 mm to 5 dm.

Preferably, the thermoelectric device may have dimensions of the legs allowing for relatively low resistance and relatively high power.

The electrolyte composition in the legs may have a thickness of about 1 cm. The temperature difference over such a leg may be up to e.g. about 100 K.

The electrolyte composition in the legs may be of a given material having a thickness of about 50-100 μm. The temperature difference over such a leg may be up to e.g. about 30 K, given a temperature below 200° C. on the hot side.

The figure-of-merit may be in the range of from 0.1 to 2, or in the range of from 0.5 to 1.8, or in the range from 0.8 to 1.5. A relatively high Seebeck voltage is preferable.

Both the dimension of the connector 145 and the dimension of the legs 141, 143 influences the performance of the device.

If the connector has a relatively large length compared to its width/thickness, the resistance of the connector is very large since the ions need to travel a long distance, which may limit the power of the device.

If the connector 145 has a length Lc in about the same range as its width/thickness, typically a length which is not more than 10 times larger than the width/thickness, more typically not more than 5 times larger than the width/thickness, the resistance of the connector 145 is small, which is favorable in term of internal resistance.

However, considering a relatively thick connector 145 (Lc>>), typically larger than twice the thickness L of a leg 141, 143, also implies that there is a large temperature drop across the connector that cannot be used for thermoelectric generation. So, in a relatively thick connector the voltage will drop, which will decrease the power of the device. However, there might be areas of applications where this is acceptable.

Theoretically, there will be an optimal thickness of the connector 145 depending on its ionic conductivity and thermal conductivity. The ratio of the distance between the legs ($d_{int}$) to the width of the legs (W) may preferably be less than 1. The thickness of the connector Lc may preferably be in the same order of magnitude as the thickness of the legs L (assuming the ionic conductivity and the thermal conductivity of the legs and connector are of the same order of magnitude).

The dimension of the conducting polymer electrodes will limit the maximum amount of charges Q (integrated current dQ/dt) that can be generated by the ionic thermoelectric generator. The dimension of the conducting electrodes will fully limit given that the generated ion concentration gradient, when running the device, is not the limiting phenomena thanks to ion reservoirs that are large enough.

The amount of charges that may be generated by a given temperature gradient before the device must be recharged and the process must be reversed, increases with the thickness of the PEDOT-PSS electrodes. Hence, it is advantageous to consider geometries where the conducting polymer electrode has a large volume, but still a close distance to the legs in order to avoid a large ionic resistance in the reservoir.

Possible architecture includes for instance a conducting polymer electrode surrounding the electrolytic reservoir, with an additional insulating layer to avoid contact with the legs.

Vertical Versus Lateral Structures

The thermoelectric device according to the invention may be a vertical devices or a lateral device. In a lateral device, FIG. 4a, the connector is normally arranged to the side of the reservoirs, and the mobile ions move in a lateral direction, substantially parallel with the surface area of the leg. In a vertical device, FIG. 4b, the connector, leg and reservoir normally at least partially covers each other, and the surface area of the electrolyte film makes up the cross section of the device. In more detail, in a vertical device the connector, leg and reservoir are normally arranged in substantially in the same plane on a substrate, and the ion flows in a direction substantially parallel with said substrate. Further, in a vertical device the connector, leg and reservoir are normally arranged on top of each other on a substrate, each element in a different plane, and the ions flow in a direction substantially normal to said substrate.

The ionic thermogenerator demonstrated in the examples is fabricated as proof of concept. It is not intended to show the design optimum to get the maximum power out of the device.

In the device presented in the examples, the length of the legs are about L=1 cm, the thickness about T=150 microns, and the width about W=1 mm. Because it is a lateral device, the cross section for the ion current (W*T) is little, the length is long and thus the resistance is high.

Thus, for a conductivity of about 1 S/m, the resistance R=1/conductivity*L/(W*T) will be about 0.1 MOhms. Assuming the resistance of the legs is the largest resistance in the device, for device with 2 legs, the internal resistance is thus 0.2 MOhms.

The maximum power of the device is obtained when the load resistance R is similar to internal resistance Rint: Pmax=Vload2/Rint.=(Voc/2)2/Rint. The load voltage across the load resistance Vload is half the open-circuit voltage Voc when the load resistance is equal to the internal resistance.

The open circuit voltage can be simply estimated by the Seebeck coefficient of the two legs and the temperature gradient used. The sum of the Seebeck coefficient for the polycation and polyanion legs is of the order of 50 mV/K. So, assuming $\Delta T=1$ degree, the open circuit voltage is 50 mV, and the load voltage is 25 mV. The maximum power is $25^2 \cdot 10^{-11} W = 6.25$ nW.

In another example, a device is constructed vertically (the temperature gradient across the thickness of the polyelectrolyte film) with the following dimensions of the legs: $L=10^{-4}$ m, $W=10^{-3}$ m, $T=10^{-2}$ m. In this case, the cross-section area, S, is given by W times T, and the length is given by L.

Given, an ionic conductivity of 1 S/m, the resistance of the leg is R=10 Ohms. Hence, simply by going to a vertical architecture, the resistance of the leg decreases by 4 orders of magnitude. Assuming the same temperature gradient, the maximum power is then 62.5 µW.

In order to further increase the power for the same temperature gradient, the number of legs in the thermoelectric modules may be increased. N legs connected in series in a thermoelectric module will increase the open circuit voltage by N times, but the internal resistance will also increase by N times. Thus, the maximum will also increase by N times.

The limitation for a vertical architecture is in the achievable temperature gradient. A thin film will lead to a small temperature gradient, thus a small Seebeck voltage and small Voc and small power output.

However for some applications, it is desirable to have thin devices, such as to put on the body (flexible) and use the heat from the body to generate electricity to power some other devices.

Thicknesses in the sub-microns are possible to use for high ZT materials such as for applications in nanoelectronics.

Most of the applications envisaged will consider a polyelectrolyte leg with a thickness of 1 micron or larger. A typical thickness of a polyelectrolyte leg is in the range of from 10 to 1000 microns.

Manufacturing Techniques

In term of manufacturing, the advantage of using a polyelectrolyte is the ability to process it starting from a solution. Hence, low cost manufacturing technique such as printing can be used. Screen printing technique is ideal to create patterns of a thickness in the range of from 1 micron to 500 micron.

In more detail, the manufacturing may be performed by means of a technique selected from a group comprising screen printing, wire-bar coating, knife coating, bar coating, spin coating, dip coating or spray coating. This is advantageous as it normally allows for short manufacturing times.

Legs of a thickness in the range larger than 1 mm might be needed for some specific applications using large temperature gradient, reaching the upper limit of what can stand the materials (max temperature 300° C.). Thicker legs can be envisaged in application with a cold side at low temperature, such as in airplane, where the temperature at 10 km altitude is −70° C. and the temperature in the plane or close to the motor is from room temperature to several hundred degrees Celsius.

In order to fabricate thick legs, in the range of from 1 mm to 10 dm, liquid handling robot can be used to fill-in plastic cavities with polyelectrolytes. It is not excluded that the polyelectrolyte can be blended with more conventional plastics such that standard manufacturing techniques for plastic, like extrusion or injection, are used.

If spin coating is used, the film of electrolyte composition may be in the range of from 1 nm to 10 µm.

Figure 15A:
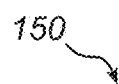

FIG. 15a further illustrates how the components of a thermoelectric device 150 according to the present disclosure may be positioned. The electrode 154, reservoir 157, legs 151 and 152 and a connector 155 of the device is illustrated in FIG. 15a. It may be advantageous to consider geometries where the conducting polymer electrode 154 has a large volume, but still a close distance to the legs 151, 152 in order to avoid a large ionic resistance in the reservoir 157. Possible architecture includes for instance a conducting polymer electrode 154 surrounding the electrolytic reservoir 157, with a additional insulating layer 158 to avoid contact with the legs 152.

For a multi-legs device, the conducting polymer electrode can be considered up to 10 times thicker than overall thickness of the "leg+connector", i.e. $Z_{polymer}$ may be up to 10 times thicker than $Z_a$. However, the conducting polymer electrode may also be up to about 100 times the thickness of the "leg+connector"

A multi-legged device is further illustrated in FIG. 15b, in which several connectors 155 and legs 151, 152 are coupled in series to an electrode 157. This device also comprises an insulator layer 155.

EXPERIMENTAL EXAMPLES

Example 1

Thermoelectric Properties of Polyelectrolytes

The thermoelectric properties of the polyanion poly(styrene sulfonate) (PSS) with mobile sodium cations (Na$^+$) and the polycation poly-2-[(methacryloyloxy)-ethyl]trimethyl-ammonium (PMADQUAT) with mobile chloride anions (Cl$^-$) are measured in the device illustrated in FIG. 3. This device can be considered as the elementary power generator for a polyelectrolyte.

A glass substrate 352 with two pre-patterned gold electrodes 353, 354 by thermal evaporation (1 mm in width, 53 mm in length, approx. 100 nm in thickness for each and 1 mm apart from each other). Solution polyelectrolytes 351 (PSSNa or PMADQUAT, 2 wt % in distilled (DI) water, 40 µl) were drop-casted on the prepared substrate and dried naturally. The obtained films give the thickness as 1.66 µm for PSSNa and 1.16 µm for PMADQUAT.

A temperature difference is then applied between the two gold electrodes by a heater 355 and cooler 366 positioned below the glass substrate. An electric potential can be measured between the two gold electrodes.

Figure 5:
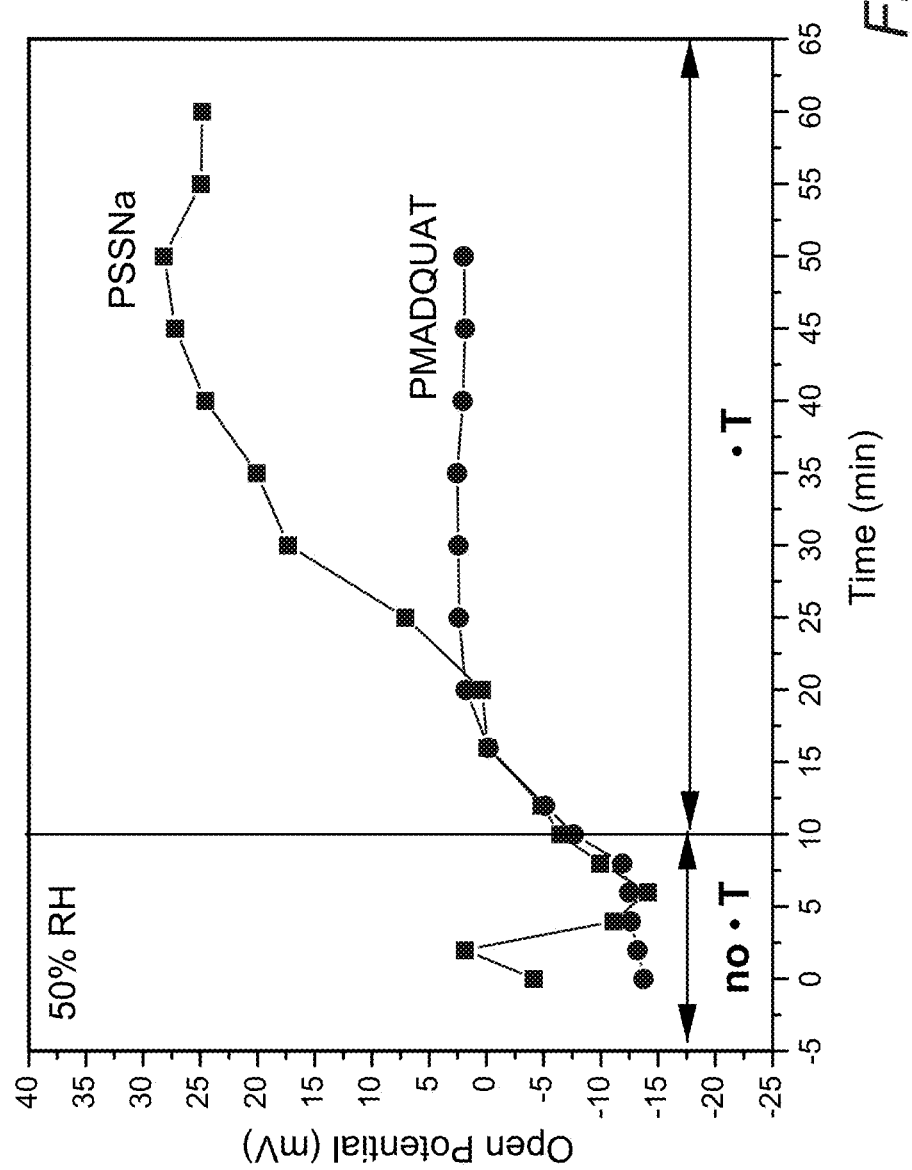
FIG. 5 is a plot of open potential versus time.

Without temperature gradient the potential between the two gold electrodes is small and fluctuates, see also FIG. 5. Upon heating, a temperature difference arises and the open circuit voltage, $V_{OC}$, increases with time, and stabilizes at well defined values: $V_{oc}$=24.84 mV/K for PSSNa and 1.96 mV/K for PMADQUAT when the measurement is performed at a relative humidity of 50% RH. The Seebeck coefficient is defined as the measured open circuit voltage, $V_{OC}$, divided by the temperature difference at the two gold electrodes, $\Delta T_{Au}$.

By the term relative humidity, it is herein meant the ratio of the actual amount of water vapor (absolute humidity) present in the air to the saturation point at the same temperature.

Figure 6:
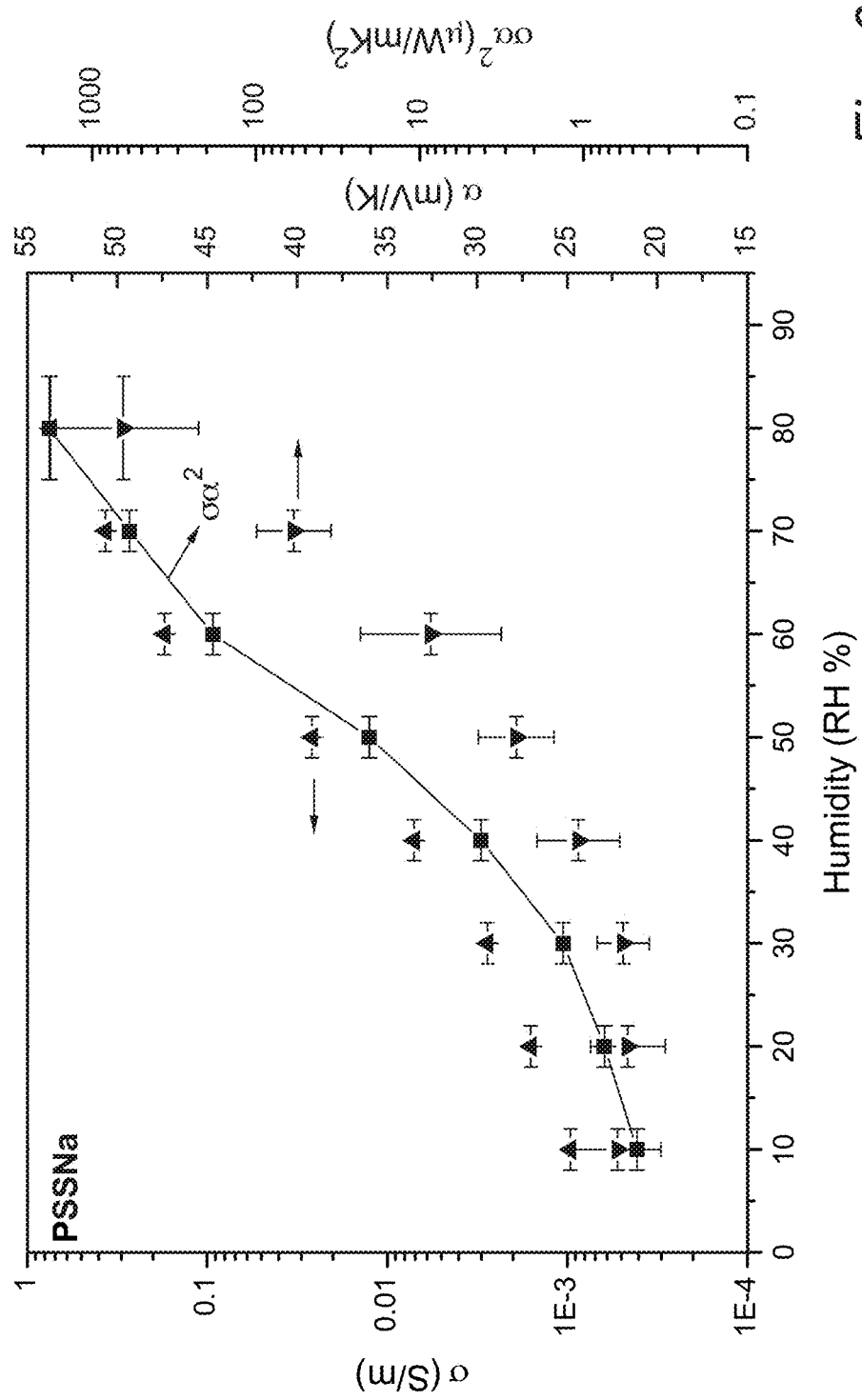
FIGS. 6-7 are plots of ionic conductivity and ionic Seebeck coefficient, respectively.
Figure 7:
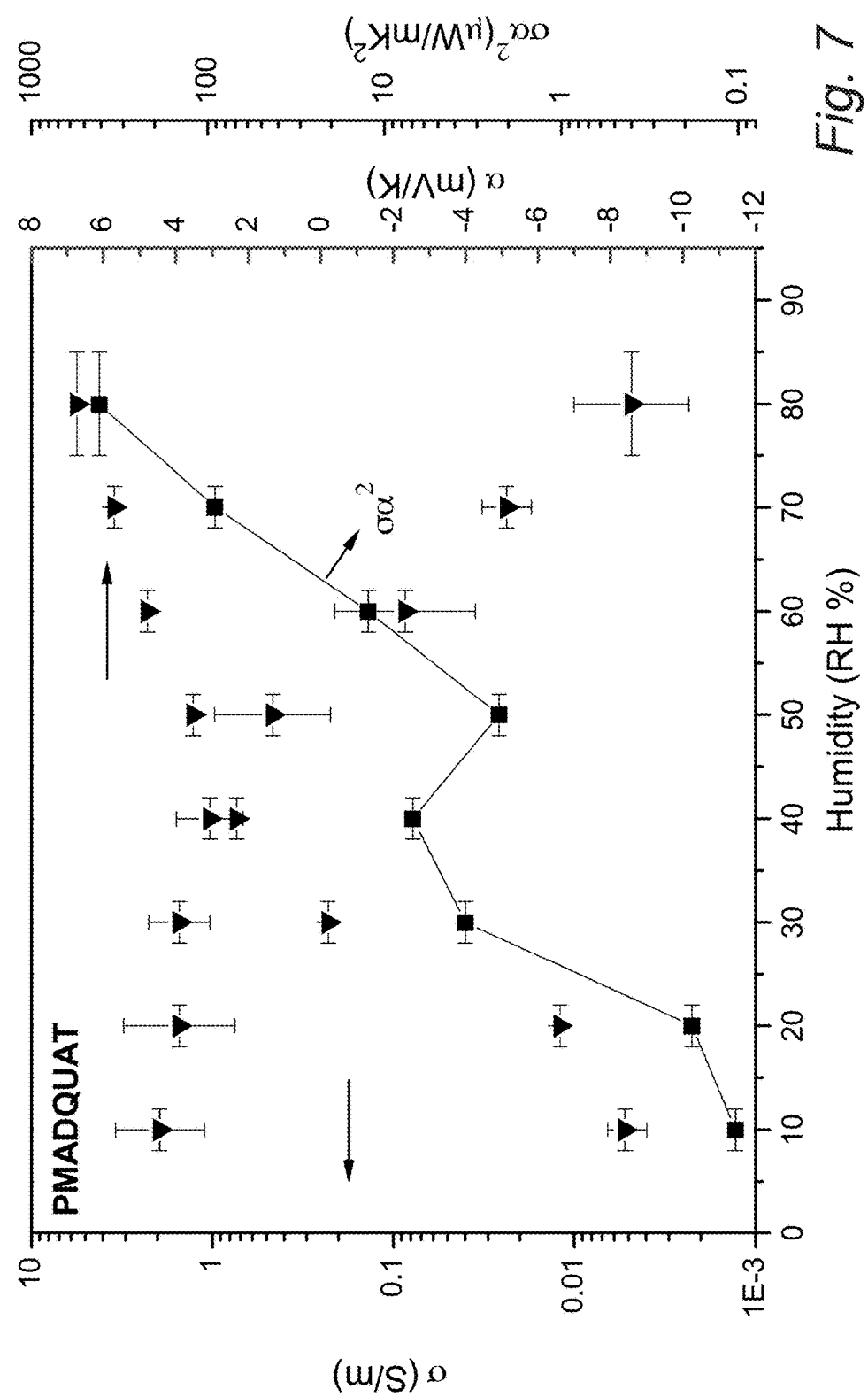

The ionic conductivity, σ, and ionic Seebeck coefficient, α, can be systematically measured for different values of relative humidity. The ionic conductivity is typically low in dry films (for instance, ~$10^{-3}$ S/m at 10% RH) and increases drastically up to 0.74 S/m for PSSNa and 5.57 S/m for PMADQUAT at 80% RH, as can be seen in FIGS. 6 and 7, respectively.

When a temperature gradient, $\Delta T_{Au}$, of 1.2 K is imposed between the two gold electrodes coated by the polyelectrolyte films, the mobile ions are expected to thermo-diffuse towards the cold electrode and generate a measurable thermo-voltage. For humid films, it is clear that the sign of the mobile charged ions dictates the sign of the thermo-voltage. The polyanion PSSNa possesses a positive ionic Seebeck coefficient of +50 mV/K at 80% RH; while the polycation PMADQUAT displays a negative ionic thermo-power of −9 mV/K at 80% RH. Both the thermovoltage and the conductivity increase with the humidity, which supports the direct involvement of mobile ions in the thermo-voltage.

Compared to electronic thermoelectrics, the power factors ($\sigma\alpha^2$) of these ionic thermoelectrics are surprisingly high: 1830 $\mu W m^{-1} K^{-2}$ for PSSNa and 410 $\mu W K^{-2} m^{-1}$ for PMADQUAT at 80% RH. Assuming a thermal conductivity of $\lambda = 0.3$ WK−1m−1 as typical for a polymer gel, thermoelectric figure-of-merit (ZT) is 1.8 for PSSNa and 0.4 for PMADQUAT, equivalent to the best electronic thermoelectric materials.

Example 1bis

Figure 18:
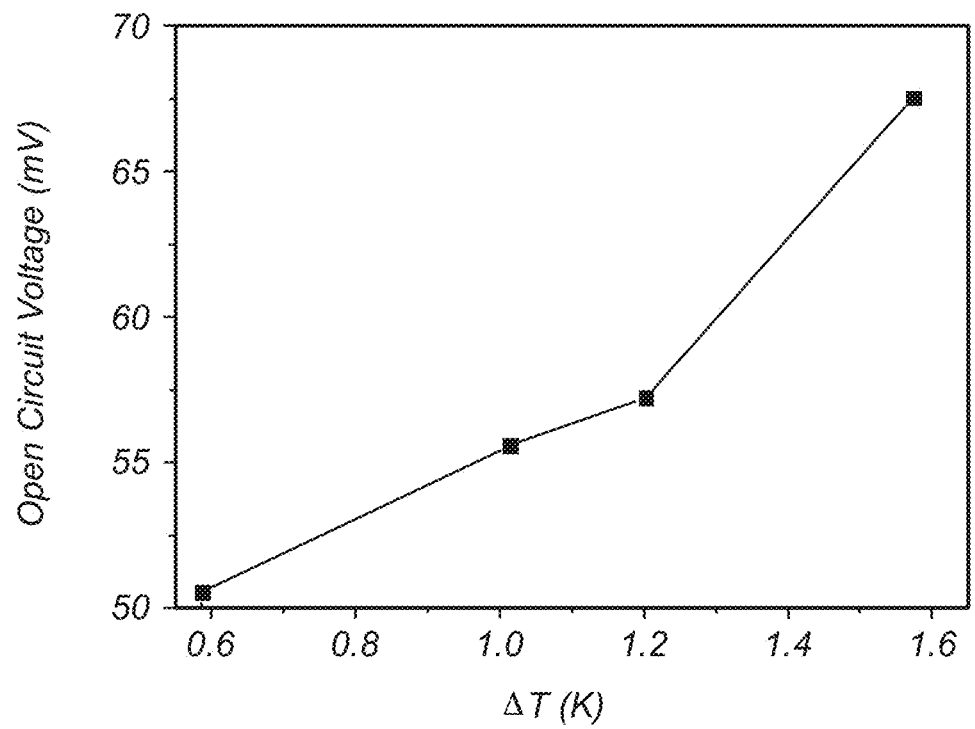
FIG. 18 shows the evolution of the open-circuit potential in the single leg PSSNa ionic thermoelectric generator.
Figure 19:
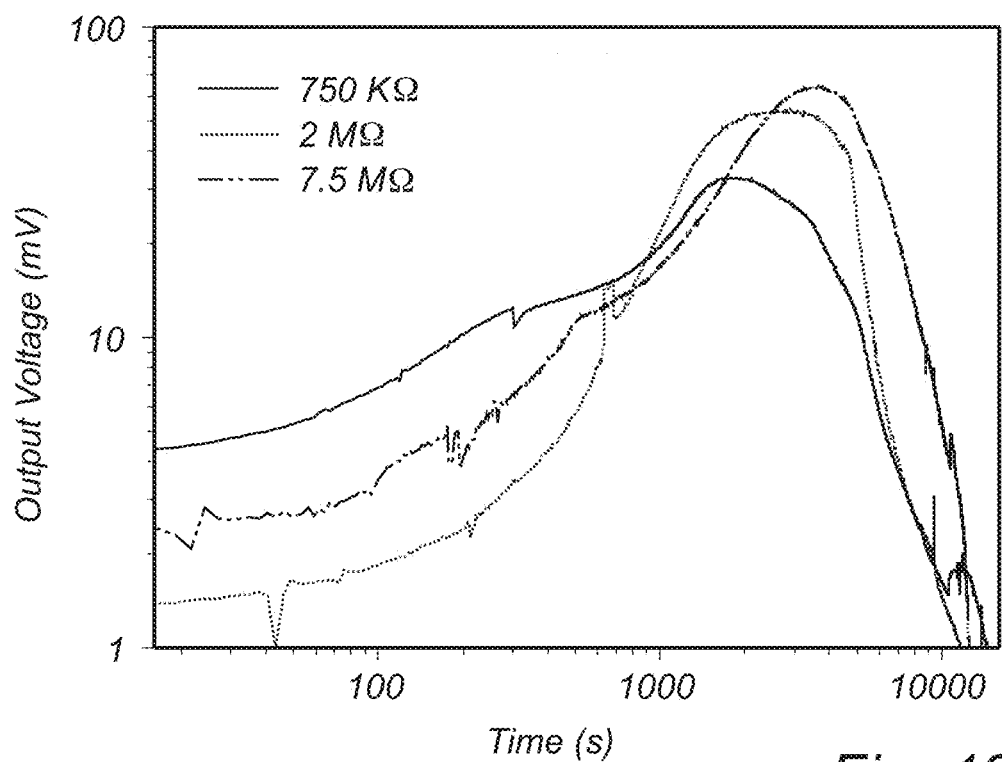
FIG. 19 shows the evolution of the output voltage versus time for the single leg PSSNa ionic thermoelectric generator submitted to a temperature gradient $\Delta T=1.2$ and connected to various load resistance (750 Ohms, 2 MOhms, 7.5 MOhms).
Figure 20:
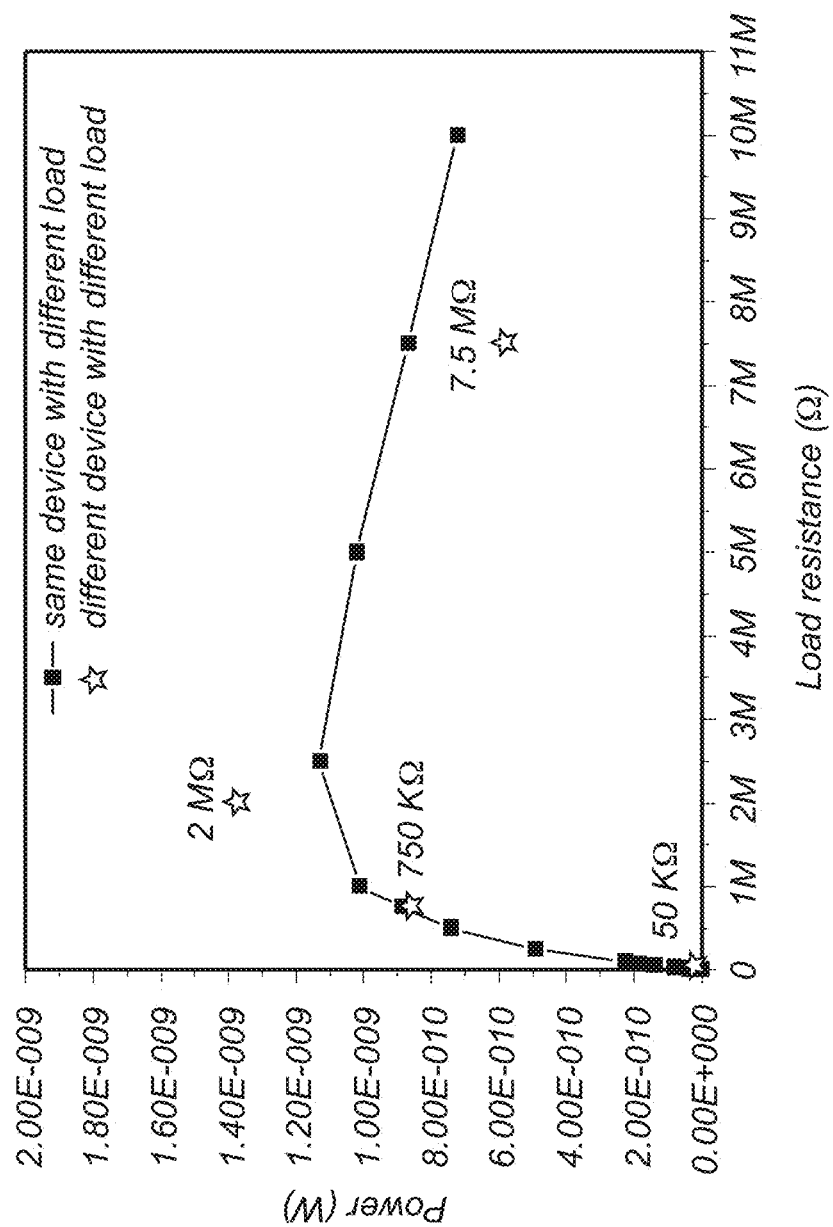
FIG. 20 shows the thermogenerated electrical power for the single leg PSSNa device with different load resistance ($\Delta T=1.2$). The solid black symbol corresponds to the same device connected subsequently to various load resistance. The star symbols corresponds to different devices with different load ($\Delta T=1.2$) generated from the output voltage curves in FIG. 19.

Electric Power Generation from One Leg Device or from Multiple Single-Leg Devices The open-circuit voltage of the device increases linearly with the temperature gradient (FIG. 18) and its value is about 55 mV for 1 K, which is close to the measured ionic Seebeck coefficient with the Au electrodes The device is then connected to a load resistance and the output voltage across the load is followed versus time. At the origin of the time axis, there is no temperature difference, but a temperature gradient is increased until it reaches a constant value of $\Delta T=1.2$ K at about 1500 seconds. The initial output voltages are smaller than the open-circuit voltage, as expected for a generator connected to a load resistance, but it increases steadily to become larger than the open-circuit voltage to reach a maximum at 64 mV (R=7.5 MOhms), 53 mV (R=2 MOhms), 32 mV (750 kOhms). This increase in the output voltage corresponds to an induced thermo-generated current of 8.53 nA, 26.5 nA, and 42.6 nA and a maximum electrical power of 0.546 nW, 1.40 nW and 1.36 nW, for respectively R=7.5 MOhms, 2 MOhms and 750 kOhms. The total charge stored electrochemically in the two PEDOT-PSS electrodes is Q=0.0001 coulombs. Like any electric power generator, the power output depends on the load resistance and possesses a maximum when the load resistance is equal to the internal resistance, here about 2.5 MOhms (FIG. 20.

Example 2

Point of the Electrochemically Active Electrodes

The strategy to increase the thermo-voltage is to connect polycation and polyanion legs electrically in series and thermally in parallel, since they have Seebeck voltages of opposite sign. PSSNa has a positive ionic Seebeck coefficient, $\alpha$, while PMADQUAT shows a negative Seebeck voltage at high humidity level. PSSNa may be defined as a P-leg and PMADQUAT as a N-leg.

Device 4, arranged generally as described in relation to FIG. 1, and in more detail a connector to conduct ions comprising an aqueous solution of NaCl, two ion reservoirs comprising a NaCl solution of the same concentration as the solution in the connector, a first and a second leg, respectively, and electrochemically active PEDOT-PSS electrodes. The reservoirs are in contact with the legs and the electrodes.

Onto a glass substrate, two PEDOT:PSS electrodes are prepared by drop-casting the solution and baked at 50° C. (L: 18 mm, W: 15 mm and T: 8.6 um). PSSNa and PMADQUAT legs are fabricated with the their solution (2 wt % in DI water mixed with Silquest-187A silane (5 wt %)) and baked at 110° C. for 5 minutes, with the help of sticky tape frame. Then, the sticky tapes are removed. Continuously, frames for the ionic conductor (L: 11 mm and W: 6 mm) and reservoir (L: 38 mm and W: 5 mm) are fabricated thermally cross linking with SU-8 by using modes and baked at 100° C. for 4 hours. The resulting frames have the thickness as around 500 μm. Each device has the channels 1-mm-wide and 11-mm-long.

The edge electrodes of Device 4 are connected to a load resistance (50 kOhms) when a temperature gradient of 1.2° C. is applied. The output voltage measured over the resistance is recorded versus time. The Device 4 shows an increase in potential versus time upon applying the temperature difference. A true electrical power is generated from the temperature difference. The potential reaches a plateau indicative that the temperature gradient is now constant. In this specific experiment, the output voltage suddenly drops after 4500 s because the reservoirs are dried due to that the water of the NaCl solution has evaporated at the hot side.

Figure 8:
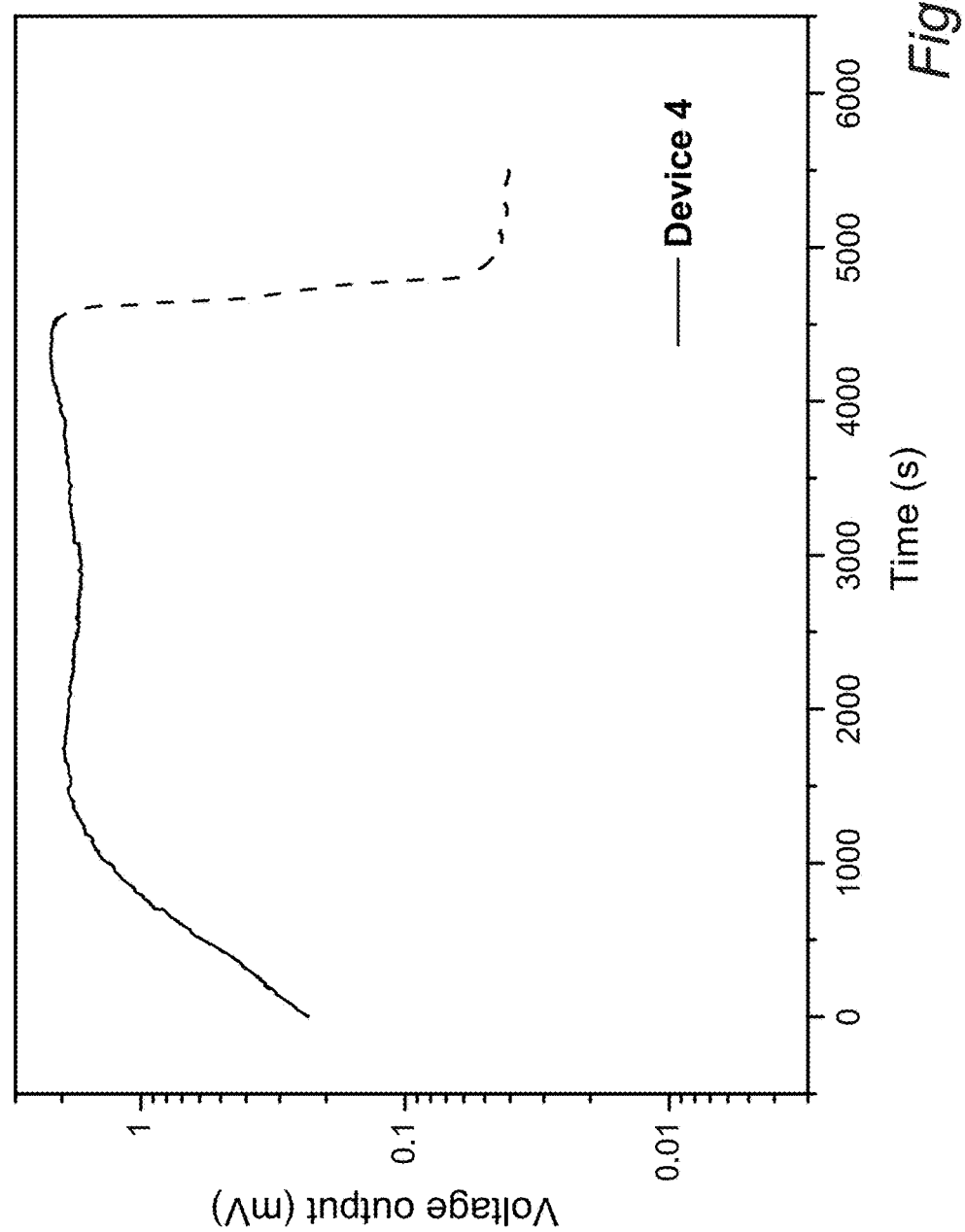
FIG. 8-11 show different measurement results made on example devices.

In Device 4, the temperature difference per mm is 1.2 K, and the Voltage output is illustrated in FIG. 8.

Example 3

Improvement of the Connector and Reservoir

Figure 9:
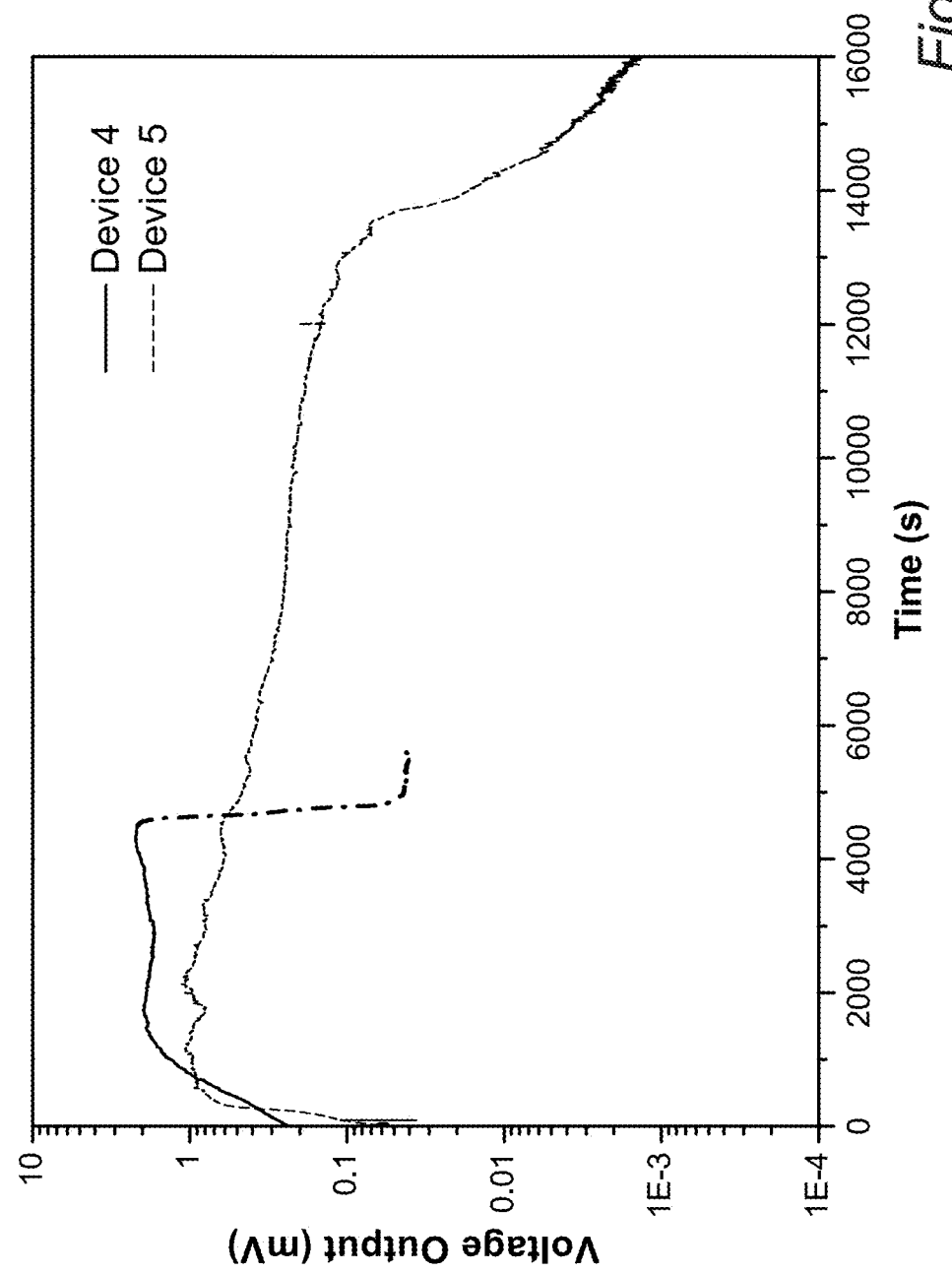

The Device 5 is fabricated in the same way as Device 4 but the reservoir and ionic connectors are composed of a gel comprising NaCl 1M with 10% polyethyleneoxide (PEO). The presence of polyethyleneoxide in the gel slow down the evaporation of water and the output potential can be maintained and recorded for a longer time than for Device 4 (given the same load resistance and the same applied temperature difference), as is illustrated in FIG. 9.

Figure 10:
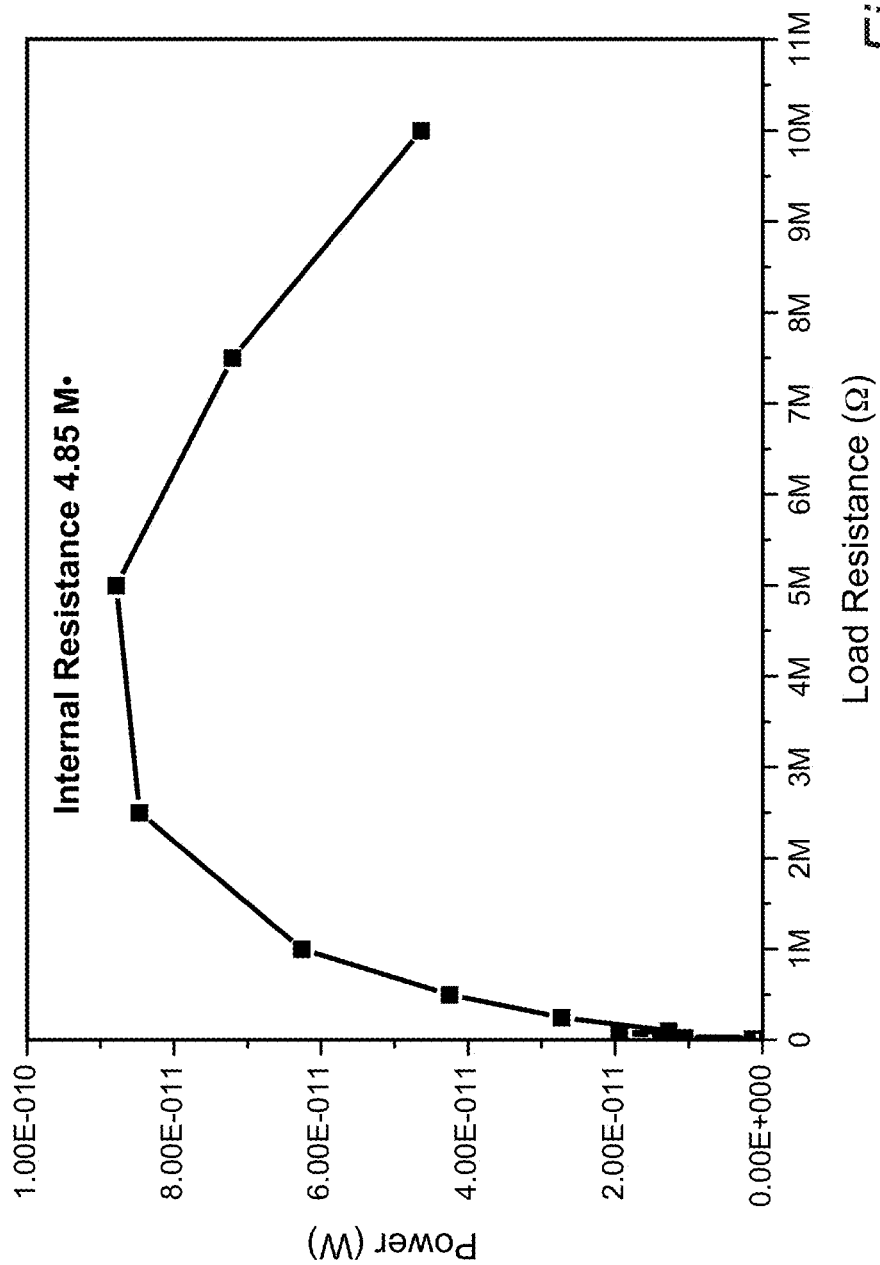

Any power generator has its own internal resistance $R_{in}$. When the load resistance is equal to the internal resistance, the power of the generator is maximum. This is observed also for our device, see also FIG. 10.

Example 4

Charge and Discharge

Figure 11:
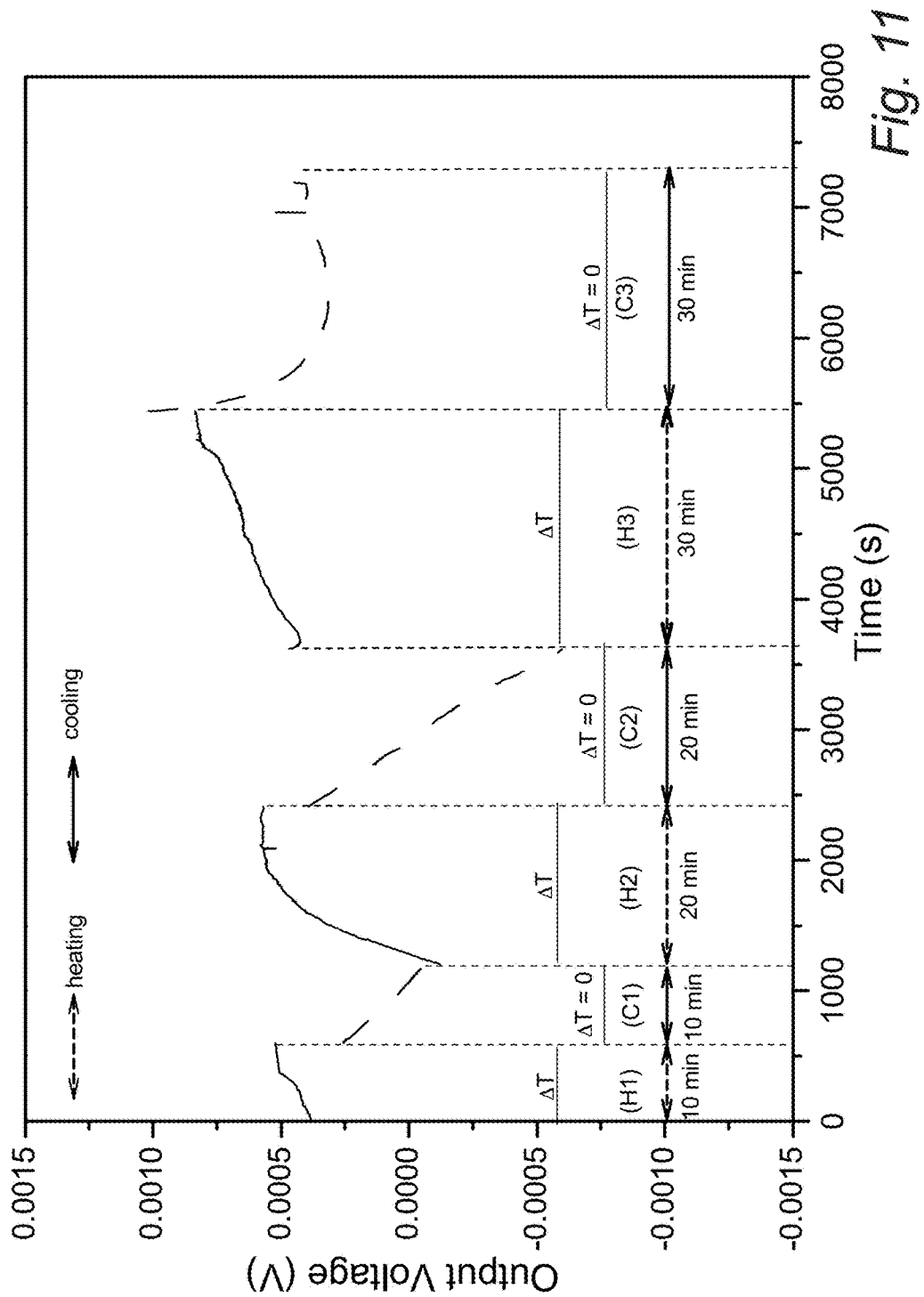

The output voltage over a resistance of 50 kOhm versus time may be followed in a series of three cycles, H1+C1, H2+C2 and H3+C3, respectively, of charge ($\Delta T=1.2C$) and discharge ($\Delta T=0C$), illustrated in FIG. 11. The three heating-cooling cycles (obtained for Device 5 in $N_2$ atmosphere with 80% RH) are explained in detail below:

Heating half-cycle: Apply a temperature difference of $\Delta T=1.2C$ between the electrodes, connect the device with the load resistance and record the output voltage (H1 for 10 min, H2 for 20 min, H3 for 30 min).

Cooling half cycle: Stop heating the device and disconnect the out load R. When the temperature difference $\Delta T$ between the electrodes gets to 0, connect the load and record the output voltage for some time (C1 for 10 min, C2 for 20 min, C3 for 30 min).

For each cycle, the out load is only connected to the device when temperature difference ΔT between the electrodes is in equilibrium.

When ΔT=1.2C, an output power is measured, electrical current is generated. This leads to an electrochemical reaction in the PEDOT-PSS electrodes: one is reduced, one is oxidized. As a result, the two PEDOT-PSS electrodes are not at the same electrical potential even if no temperature gradient is applied. In other words, the heat charges a PEDOT-PSS battery cell.

When ΔT=0C, there is still an output potential across the load resistance since the two PEDOT-PSS electrodes are not at the same potential. But this potential drops during time indicating that a current discharge is measured. When this current is zero, the two PEDOT-PSS electrodes have the same oxidation level. This is equivalent to discharge a PEDOT battery.

When a temperature difference is applied to the device, the two electrodes undergo reduction and oxidation, respectively. If PEDOT is used, the PEDOT at one electrode becomes more reduced than the pristine PEDOT at the same electrode was, and the PEDOT at the other electrode becomes more oxidized than the pristine PEDOT at that electrode was. If the temperature difference is no longer applied, there is still an electric potential difference between the electrodes, in other words a charged battery. If a resistance is connected to the PEDOT electrodes, a discharge current will flow through the resistance and the ions will move in opposite direction inside the legs compared to when the temperature difference was applied.

The amount of charges that may be stored in the electrodes of this device is related to the capacitance of the electrodes and the thickness of the PEDOT-PSS layer among others.

Example 5

Multiple Legs Ionic Thermogenerators

The voltage increases with the size of the electrolyte films in the legs. Therefore, the voltage may increase by adding a number of legs. The power also increases with the size.

As an example, 1 cm² may correspond to about 1 V. If one leg corresponds to 1 μV, then a million of legs would correspond to 1 V.

In Device 6, which is a device arranged as described in relation to FIG. 12, and manufactured in an analogous manner as described above, the temperature difference per mm is 1.5 K.

For a multi-legs device, the conducting polymer electrode can be considered up to at least 10 times thicker than the overall thickness of the leg and the connector. For such large dimension of the electrode, the ionic resistance in the electrode will be limiting the internal resistance.

In term of power generation, a too large electrode will lead to a low power, but a larger total amount of charge generated, that is a longer time per a cycle.

The multiple legged device may be charged slowly, and discharged rapidly.

For applications requiring higher peak power, a thermoelectric generator slowly charging a supercapacitor, which can then deliver a large current or peak power, is a solution.

Example 6

Reduction and Oxidation of PEDOT-PSS Electrodes

In general, a heat flow caused by a temperature difference between a so-called cold and hot part of the device, respectively, is inducing a transport of $Na^+$ and $Cl^-$ ions where the ions inside the connector (hot side) tend to move towards the distal part of the legs (cold side) in relation to the connector.

The $Na^+$ tend to move through the first leg and the $Cl^-$ tend to move through the second leg. The sodium ions tend to move through the first leg as the first leg comprises an immobile anionic polymer which constitutes a negatively charged path on which the ions can move on. The chloride ions tend to move through the second leg as the second leg comprises an immobile cationic polymer which constitutes a positive charged path on which Cl– can be transported.

As $Na^+$ enters an ion reservoir, situated at the distal part of the first leg, there will be a driving force for obtaining charge balance which causes a reduction reaction at the first electrode. The first electrode is composed of $PEDOT^+PSS^-$ and the reduction reaction which occurs is:

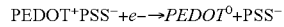
$PEDOT^+PSS^- + e^- \rightarrow PEDOT^0 + PSS^-$

During the reduction reaction, a $PSS^-$ is released and transported to the first ion reservoir to provide for charge-balance in the first ion reservoir where the $Na^+$ ion has entered due to thermodiffusion.

The second electrode is composed of $PEDOT^0$. As the $Cl^-$ enters an ion reservoir, situated at the distal part of the second leg, there will be a driving force for an oxidation to occur at the second electrode:

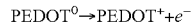
$PEDOT^0 \rightarrow PEDOT^+ + e^-$

In more detail, the reaction in the second electrode can be described as follows:

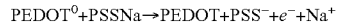
$PEDOT^0 + PSSNa \rightarrow PEDOT + PSS^- + e^- + Na^+$

In this case the $Na^+$ ion is released and transported to the second ion reservoir to provide for charge-neutralization as $Cl^-$ is entering the second ion reservoir.

By the oxidation reaction an electron is transported in an external circuit, built up between the two electrodes, from the second electrode to the first electrode where the reduction reaction occurs.

Example 7

Crosslinked Polyelectrolyte

Figure 21A:
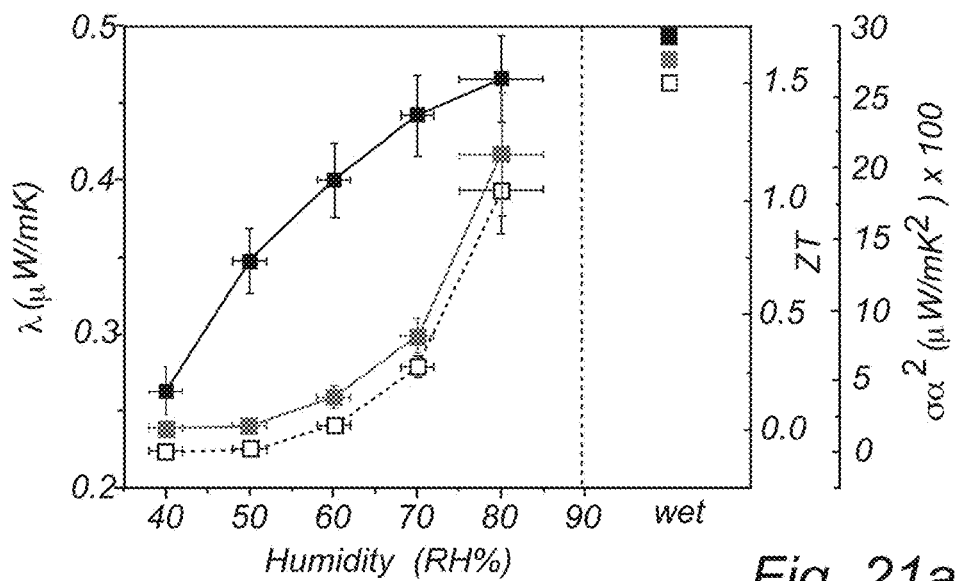
FIG. 21a shows the evolution of the ionic conductivity ($\sigma$), Seebeck coefficient ($\alpha$) and corresponding power factor ($\sigma\alpha^2$) for PSS:Na versus RH. The inset shows the chemical structure of PSS:Na.

At humidity levels higher than 80% RH, the polyelectrolyte films can lose their mechanical integrity and dissolve in the absorbed water. To prevent this a polyelectrolyte PSS:Na film was cross-linked using a polysiloxane crosslinker (Silquest-187A). This allows for characterization of the thermoelectric properties of the polyelectrolyte in wet conditions. When a reservoir of 1M NaCl is connected to the cross-linked polyelectrolyte film, the polymer film swells to reach water saturation. The ionic conductivity of this wet and salt-doped polyelectrolyte film reaches 1.2 S/m (FIG. 21a) which is close to the ionic conductivity of a liquid aqueous electrolyte. The crosslinked wet PSS:Na film possesses a large and positive ionic Seebeck coefficient of +47 mV/K (FIG. 21a); thus leading to an very high power factor ($\sigma\alpha^2$) of 2680 $\mu Wm^{-1}K^{-2}$ (FIG. 21a).

Figure 21B:
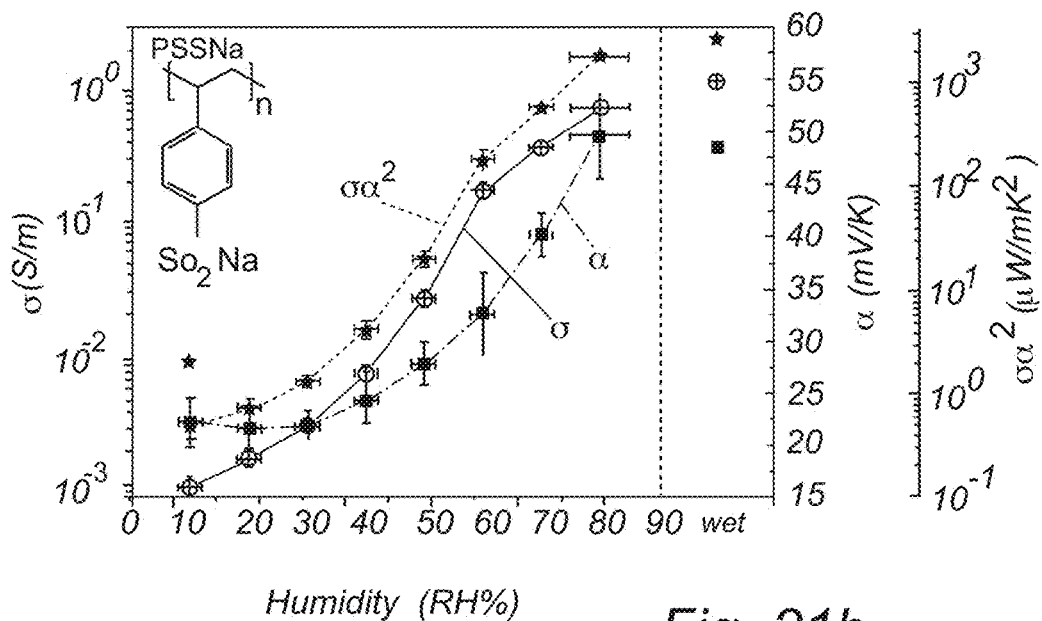
FIG. 21b shows the evolution of the thermal conductivity ($\lambda$), the power factor ($\sigma\alpha^2$) and ZT versus RH. All measurements are done at room temperature.

The thermal conductivity of the wet crosslinked PSS:Na film soaked in NaCl solution reaches 0.49 Wm$^{-1}$K$^{-1}$ (FIG. 21$b$). The cross-linked PSS film soaked with the salt solution reaches a very high ZT value of 1.6 due to the advantageous ionic conductivity as compared to the film exposed at 80% RH.

Example 8

The Thermoelectric Device as a Supercapacitor

Figure 22A:
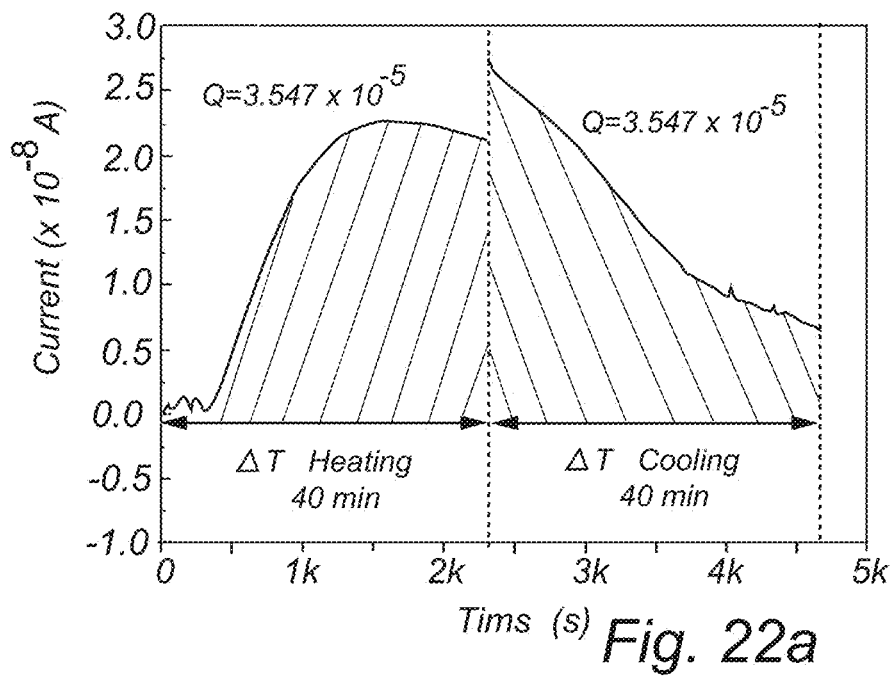
FIG. 22a shows the charge-discharge curves recorded after heating-cooling cycles (40 minutes).
Figure 22B:
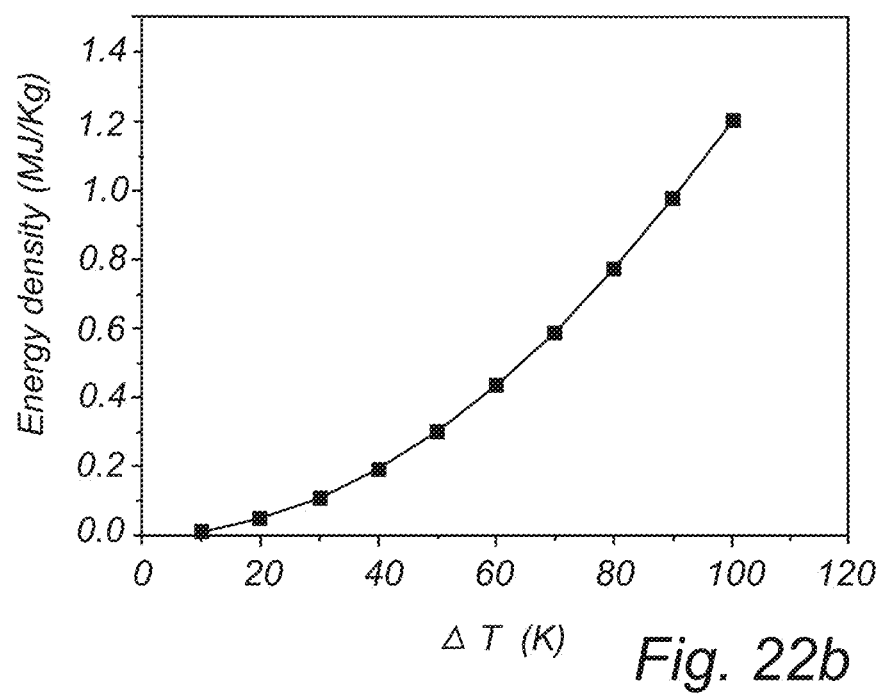
FIG. 22b shows the energy density versus temperature gradient.
Figure 23:
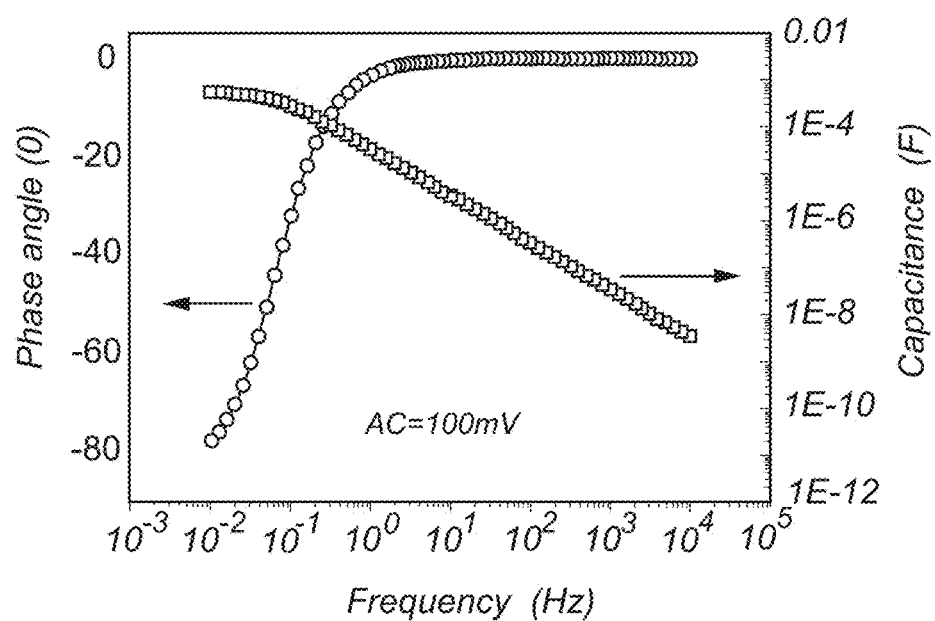
FIG. 23 shows impedance spectroscopy data. Phase angle and Capacitance for device, PEDOT:PSS/PSS:Na/PEDOT:PSS, with applied AC at 100 mV at saturated water atmosphere.

In this example the conducting polymer poly(3,4-ethylene dioxythiophene)-polystyrene sulfonate (PEDOT:PSS) used as supercapacitor electrodes. Conducting polymers transport both electronic and ionic charge carriers such that the surface notion of the electric double layer capacitor becomes a bulk notion and the specific capacitance reaches $10^5$-$10^6$ F/kg. The charge-discharge for this supercapacitor is measured by the output voltage vs. time as presented in FIG. 22 for one heating-cooling cycle in N$_2$ atmosphere at 80% RH. When a temperature gradient ($\Delta T=1.2$ K) is applied, the thermo-electric effect acts like a generator that is charging a PEDOT-PSS/PSS/PEDOT-PSS supercapacitor. When a stable temperature gradient is reached, the device is connected to the a load resistance. The current generated is recorded for 40 minutes and corresponds to an integrated charge of Q=3.55×10$^{-5}$ coulombs stored in the PEDOT:PSS electrodes. Directly after the heating half-cycle, the device is disconnected from the load resistor and the temperature gradient gradually falls to zero. When $\Delta T=0$ K, the open circuit voltage of the charged supercapacitor is $V_{oc}(\Delta T=0)$ =55.3 mV, which is of the same order of magnitude but slightly lower than the Seebeck voltage (110 mV) measured at open circuit for $\Delta T=1.2$ K (see inset of FIG. 22). This indicates that the supercapacitor is not fully charged in 40 min at this temperature gradient (as expected from the charging curve that has not reached it minimum current as in FIG. 22$a$). The specific capacitance is $C_s = QV_{oc}^{-1}M^{-1} = \sim 10^5$ Fkg$^{-1}$ (the mass of the PEDOT:PSS electrode is 0.32 mg). This value is in good agreement with the measured specific capacitance by impedance spectroscopy ($C_s = 6 \times 10^4$ F/kg, see FIG. 23) and corresponds to the values reported in the literature for conducting polymers. The charged supercapacitor is then connected to a small load resistor (50 kΩ) and its discharge is characterized. The output voltage decreases versus time. When the current level drowns within the noise level, the two PEDOT:PSS electrodes can be assumed to be back at the same oxidation level as before charging. The charge released during discharge is Q=3.47×10$^{-5}$ coulombs, thus smaller than the charge produced by the thermoelectric effect. This is attributed to the self-discharge of the polarized PEDOT:PSS electrodes. For the supercapacitor, the energy density is 173 J/kg for $\Delta T=1.2$K. The energy density increases quadratically with the temperature gradient according to $E = \frac{1}{2}C_s(\Delta T\alpha_i)^2$ (see FIG. 22$b$). The extrapolated energy density for $\Delta T=10$ K and $\Delta T=100$ K are 12 kJ/kg (3.32 Wh/kg) and 1.2 MJ/kg (332 Wh/kg). Importantly, the energy density for larger temperature gradient can be high because the ionic Seebeck voltage of the polyelectrolyte is exceptionally large. For the sake of comparison, Li-polymer batteries have an energy density of about 200 Wh/kg.

Example 9

Measurement of Specific Capacitance by Impedance Spectroscopy

Devices were fabricated by sandwiching a 50 μm thick solid-state PSS:Na film between two PEDOT:PSS film electrodes, PEDOT:PSS/PSS:Na/PEDOT:PSS. When applying an alternating current (AC) voltage across the supercapacitor, the polarization characteristics of the electrolyte strongly depends on the frequency. The device was is kept in a home-made climate chamber with saturated water atmosphere overnight. The device was connected to an impedance spectrometer through PEDOT:PSS electrodes and the frequency was swept from $10^4$ Hz to $10^{-2}$ Hz. The device was scanned with different AC varied from 1 V, 100 mV, 10 mV to 1 mV, respectively, which display similar capacitive behavior. The phase angle and capacitance versus frequency with AC at 100 mV are given in FIG. 23. The phase angle of the device reaches low angle (<−45°) at low frequency, implying that device showing a dominant capacitive behavior at those frequencies. For the capacitance, it increases with the frequency and saturates at low frequencies, around 7×10$^{-4}$ F. With the mass of the PEDOT:PSS, the specific capacitance for the PEDOT:PSS was calculated as about 6×10$^4$ FKg$^{-1}$.

It should be noted that the invention has mainly been described above with reference to a few embodiments. However, as is readily appreciated by a person skilled in the art, other embodiments than the ones disclosed above are equally possible within the scope of the invention, as defined by the appended patent claims.

It is further noted that, in the claims, the word "comprising" does not exclude other elements or steps, and the indefinite article "a" or "an" does not exclude a plurality. A single apparatus or other unit may fulfill the functions of several items recited in the claims. The mere fact that certain features or method steps are recited in mutually different dependent claims does not indicate that a combination of these features or steps cannot be used to an advantage.

The invention claimed is:

1. A thermoelectric device comprising:
   a first electrode;
   a second electrode;
   a first electrolyte composition capable of transporting cations;
   a second electrolyte composition capable of transporting anions; and
   a connector comprising a cation and anion transporting composition, the connector comprising mobile cations and mobile anions,
   wherein the first electrolyte composition is connected to said first electrode by being in ionic contact and the second electrolyte composition is connected to said second electrode by being in ionic contact and said connector is in ionic contact with said first and said second electrolyte composition,
   such that an applied temperature difference over said first and second electrolyte compositions or an applied voltage over said first and second electrodes facilitate transport of ions to and/or from said first and second electrodes via said first and second electrolyte compositions in accordance with a Soret effect, the ions themselves not being electrochemically active.

2. The thermoelectric device according claim 1, wherein said first electrolyte composition comprises an anionic polymer and/or said second electrolyte composition comprises a cationic polymer.

3. The thermoelectric device according to claim 1, wherein the first and second electrodes comprise a material having a specific capacitance in a range of 10 F/g to 1000 F/g, a material having a specific surface area in a range of 50 m$^2$/g to 5000 m$^2$/g, or an electrically conductive polymer composition capable of being reduced and/or oxidized.

4. The thermoelectric device according to claim 1, further comprising at least one ion reservoir at a junction between said first electrolyte composition and said first electrode and/or at a junction between said second electrolyte composition and said second electrode.

5. The thermoelectric device according to claim 1, wherein said first electrode, said second electrode, said first electrolyte composition, said second electrolyte composition and/or said connector can be applied by liquid deposition techniques.

6. The thermoelectric device according to claim 1, arranged on a flexible solid substrate.

7. The thermoelectric device according to claim 1 for generating electric current comprising a first leg connected to said first electrode and a second leg connected to said second electrode, wherein said first and second legs are coupled via the connector, wherein said first leg is connected to said first electrode by being in ionic contact, said second leg is connected to said second electrode by being in ionic contact, and said connector is in ionic contact with said first and said second legs; wherein said connector comprises a composition comprising mobile cations and mobile anions said device further comprises a first ion reservoir being in ionic contact with said first leg, and said first electrode and a second ion reservoir being in ionic contact with said second leg and said second electrode, wherein said first and second ion reservoirs and said connector are spatially isolated from each other;

wherein said first leg comprises the first electrolyte composition being capable of transporting the cations from said connector to said first ion reservoir, said second leg comprises the second electrolyte composition being capable of transporting the anions from said connector to said second ion reservoir;

and wherein said first electrode comprises a layer of a first electrically conductive polymer composition capable of being reduced which is in ionic contact with said first ion reservoir, and said second electrode comprises a layer of a second electrically conductive polymer composition capable of being oxidized which is in ionic contact with said second ion reservoir.

8. The thermoelectric device according to claim 1 for generating a temperature difference comprising a first leg connected to said first electrode and a second leg connected to said second electrode, wherein said first and second legs are coupled via the connector, wherein said first leg is connected to said first electrode by being in ionic contact, and said second leg is connected to said second electrode by being in ionic contact;

said device further comprises a first ion reservoir comprising mobile cations, being in ionic contact with said first leg, and said first electrode and a second ion reservoir comprising mobile anions, being in ionic contact with said second leg and said second electrode, wherein said first and second ion reservoirs and said connector are spatially isolated from each other;

wherein said first leg comprises the first electrolyte composition being capable of transporting the cations from said first ion reservoir to said connector said second leg comprises the second electrolyte composition being capable of transporting the anions from said second ion reservoir to said connector;

wherein said connector comprises the cation and anion transporting composition in ionic contact with said first and said second legs;

and wherein said first electrode comprises a layer of a first electrically conductive polymer composition capable of being oxidized which is in direct contact with said first ion reservoir, and said second electrode comprises a layer of a second electrically conductive polymer composition capable of being reduced which is in direct contact with said second ion reservoir.

9. A method for generating electric current comprising:

providing the thermoelectric device according to claim 1, and applying a temperature difference over said first and second electrolyte compositions.

10. The method according to claim 9, comprising providing a first temperature in said connector and a second temperature in first and second ion reservoirs, wherein said first temperature is lower than said second temperature.

11. A method for generating a temperature difference comprising:

providing the thermoelectric device according to claim 1, and applying a potential difference between said first and second electrodes.

* * * * *